(12) United States Patent
Morita et al.

(10) Patent No.: US 7,893,783 B2
(45) Date of Patent: Feb. 22, 2011

(54) RESONATOR, OSCILLATOR, AND COMMUNICATION APPARATUS

(75) Inventors: Shinya Morita, Kanagawa (JP); Akira Akiba, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/123,913

(22) Filed: May 20, 2008

(65) Prior Publication Data

US 2008/0284528 A1 Nov. 20, 2008

(30) Foreign Application Priority Data

Oct. 3, 2006 (JP) .............................. 2006-272209
May 23, 2007 (JP) .............................. 2007-136941

(51) Int. Cl.
*H03B 5/30* (2006.01)
(52) U.S. Cl. ...................... 331/156; 331/56; 331/116 M

(58) Field of Classification Search .................. 331/56, 331/116 M, 156, 107 DP
See application file for complete search history.

(56) References Cited

U.S. PATENT DOCUMENTS

| 6,249,073 | B1 | 6/2001 | Nguyen et al. | |
| 6,859,113 | B2 * | 2/2005 | Giousouf et al. | ........ 331/116 M |
| 7,352,254 | B2 * | 4/2008 | Tanaka | ................... 331/116 M |

FOREIGN PATENT DOCUMENTS

JP 2006-33740 2/2006

* cited by examiner

*Primary Examiner*—Robert Pascal
*Assistant Examiner*—James E Goodley
(74) *Attorney, Agent, or Firm*—SNR Denton US LLP

(57) ABSTRACT

Disclosed is a resonator including a plurality of resonator elements each including at least oscillation parts and lower electrodes with an intervening space therebetween, in which the plurality of resonator elements are disposed in a closed system and the oscillation parts of the plurality of resonator elements are continuously formed in an integrated manner.

18 Claims, 18 Drawing Sheets

RESONATOR, OSCILLATOR, AND COMMUNICATION APPARATUS

CROSS REFERENCES TO RELATED APPLICATIONS

The present invention contains subject matter related to Japanese Patent Applications JP 2006-272209 and JP 2007-136941 filed in the Japanese Patent Office on Oct. 3, 2006 and May 23, 2007, respectively, the entire contents of which being incorporated herein by reference.

BACKGROUND OF THE INVENTION

1. Field of the Invention

The invention generally relates to resonators, oscillators, and communication apparatuses. More particularly, the invention relates to a resonator utilizing mechanical oscillations, an oscillator including the resonator, and a communication apparatus incorporating the oscillator.

2. Description of the Related Art

With the recent development of radio communication technology, the reduction in size and weight has been demanded on communication apparatuses utilizing the radio communication technology. Into the area of RF signal-processing which has been considered difficult so far to realize the reduction, micro-electromechanical system (MEMS) technology, which is fabricating minute mechanical structures making use of the semiconductor microfabrication technology, has been introduced.

An example of the MEMS technology includes a mechanical resonator utilizing mechanical resonance. Since RF device elements such as a filter, oscillator, mixer and other similar devices using the mechanical resonator are relatively small in size and can be integrated, the application of the resonators and RF elements is expected into the sectors of telecommunication. The technology of the mechanical resonator has been disclosed in Japanese Unexamined Patent Application Publication No. 2006-33740 and U.S. Pat. No. 6,249,073.

SUMMARY OF THE INVENTION

Incidentally, in the case where an oscillator is formed using a resonator, for example, it is preferable that the insertion loss be low as the oscillator and Q value is high as the resonator. Since mechanical resonators have high impedance, in general, it is preferable to reduce the impedance by connecting plural similar resonator elements in parallel, i.e., parallelizing the resonator elements. This parallelization, however, gives rise to the decrease in Q values for the resonators.

As the causes for decreasing the Q value of parallel resonator utilizing the mechanical oscillation, the following two points can be put forward; (1) the variability in characteristics between unit resonator elements included in the parallel resonator, and (2) the leak of kinetic energy of an oscillation part toward a substrate by way of a supporting part. The situation with regard to the point (2) is the same for a single resonator as well. These two causes will be described hereinbelow.

The cause (1) is now detailed. In order to reduce the insertion loss of mechanical resonator, it is preferable to reduce the impedance by parallelizing plural similar resonator elements, as mentioned above. When parallelizing unit resonators in general, as shown in FIGS. 1A and 1B, a plurality of resonator elements may be parallelized by locating the elements in a two-dimensional array. Referring to FIGS. 1A and 1B, a parallel resonator 1 is formed by disposing a plurality of the resonator elements each of which is the resonator element 2, as a unit, shown in FIG. 2.

The resonator element 2 is formed, as shown in FIG. 2, by disposing an input electrode (so-called input signal line) 4 and an output electrode (so-called output signal line) 5 both formed on a substrate 3, and an oscillation part (so-called beam) 7 held in air facing the input and output electrodes, 4 and 5, with an intervening space 6 therebetween. The oscillation part 7 is also formed to be supported at the both ends thereof by supporting parts 8 (8A, 8B) fixed onto wiring layers 9, and to intersect the input and output electrodes 4 and 5.

As shown in FIGS. 1A and 1B, the parallel resonator 1 is formed by arranging a plurality of resonator elements 2 (refer to FIG. 2) on a common substrate 3 in the two-dimensional array, connecting the supporting parts 8 (8A, 8B) connected to oscillation parts 7 line by line by seats 9 with conductivity, and interconnecting the seats 9 at the end of each line, so that the oscillation parts 7 come to be connected in common. The oscillation parts 7 are supplied with DC bias voltage V. On the other hand, the input electrodes 4 and output electrodes 5, which are disposed intersecting the oscillating parts 7, are respectively grouped together to be connected in common.

With regard to resonance characteristics of each resonator element 2 in the configuration of FIGS. 1A and 1B, variability in resonance frequency is found between the outer and center regions of the array. As the causes for producing the variability in resonance frequency, two points may be mentioned. That is, the difference between the outer and center regions of the array (a) in stress exerted to the oscillation part (the so-called oscillation part 7) and (b) in easiness of generating variability in the structural parameter such as film thickness (particularly, the thickness of the oscillation part) and the like, during the fabrication process of resonator element 2.

Therefore, if the frequency is distributed from one place to another within the parallel resonator, the abovementioned variability results in the decrease in Q value compared with the single resonator. In order to obviate the decrease in the Q value due to the parallelization, it is preferable to reduce the variability in the resonance frequency in the parallel resonator. However, in the case where the resonator elements 2 are arranged in the array, it is difficult to eliminate over the resonator elements 2 the abovementioned difference in the stress exerted to the oscillation part, the structural variability, and the like.

The cause (2) is described in details as follows. In order to increase Q value of the resonator, it may be essential not to dissipate the kinetic energy of the oscillation part to the substrate. In the resonator elements 2 arranged in the array, each oscillation part 7 is supported by the supporting parts 8 (8A, 8B) separated from other oscillation parts 7 included in the neighboring resonator elements 2 (refer to FIG. 1B). As a result, some of the kinetic energy of each resonator element 2 leak out toward the side of substrate 3 through the supporting part 8 (8A, 8B), and this results in the decrease in the Q value.

According to an embodiment of the invention, there is provided a parallelized resonator with increased Q values by equalizing the structure of, and the stress exerted to, each oscillator element included in the resonator. According to another embodiment of the invention, there is provided an oscillator including the parallel resonator, and a communication apparatus incorporating the oscillator.

A resonator according to an embodiment of the invention includes a plurality of resonator elements, each having oscillation parts and lower electrodes with an intervening space therebetween, disposed in a closed system, and forming the oscillation parts of the plurality of resonator elements continuously as an integrated structure.

With regard to the resonator according to an embodiment of the invention, by disposing the plurality of resonator elements to form a closed system, and forming the oscillation parts of the plurality of resonator elements continuously as an integrated structure, in the parallel resonator including the plurality of resonator elements connected with each other, the structure of each oscillator element is equalized with each other and the stress exerted to each oscillator element is also equalized.

An oscillator according to an embodiment of the invention includes a resonator having a plurality of resonator elements, each including oscillation parts and lower electrodes with an intervening space therebetween, disposed in a closed system, and forming the oscillation parts of the plurality of resonator elements continuously as an integrated structure.

With regard to the oscillator according to an embodiment of the invention, since the structure thereof include a parallel resonator formed by disposing the plurality of resonator elements to form a closed system, and forming the oscillation parts of the plurality of resonator elements continuously as an integrated structure, the structure of each of the oscillator elements included in the parallel resonators is equalized with each other and the stress exerted to each of the oscillator elements is also equalized. As a result, excellent oscillator characteristics can be obtained.

A communication apparatus according to an embodiment of the invention includes an oscillator to be incorporated into the communication apparatus provided with an oscillation circuit adapted to frequency conversion, in which the oscillator is formed by including a plurality of resonator elements, each including oscillation parts and lower electrodes with an intervening space therebetween, disposed in a closed system, and forming the oscillation parts of the plurality of resonator elements continuously as an integrated structure.

With regard to the communication apparatus according to an embodiment of the invention, since the abovementioned parallel resonator is utilized as the oscillator included in the apparatus, excellent characteristics are obtained.

With the resonator according to an embodiment of the invention, a parallel resonator with high Q values can be provided. With the oscillator according to an embodiment of the invention, an oscillator with high frequency stability can be provided. With the communication apparatus according to an embodiment of the invention, excellent oscillator characteristics are obtained and a highly reliable communication apparatus can be provided.

DESCRIPTION OF THE PREFERRED EMBODIMENTS

Figure 1A:
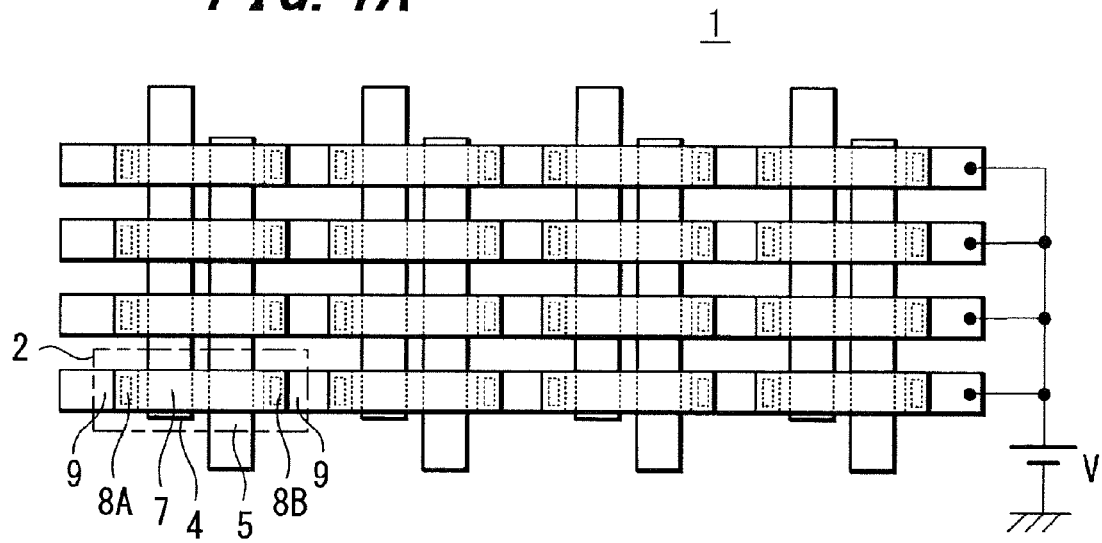
FIG. 1A and 1B are a schematic plan view illustrating an example of a parallel resonator in an arrayed structure, and a cross-sectional view of the structure of FIG. 1A, respectively.

Referring now to the drawings, various embodiments of the invention will be described hereinbelow.

Figure 3A:
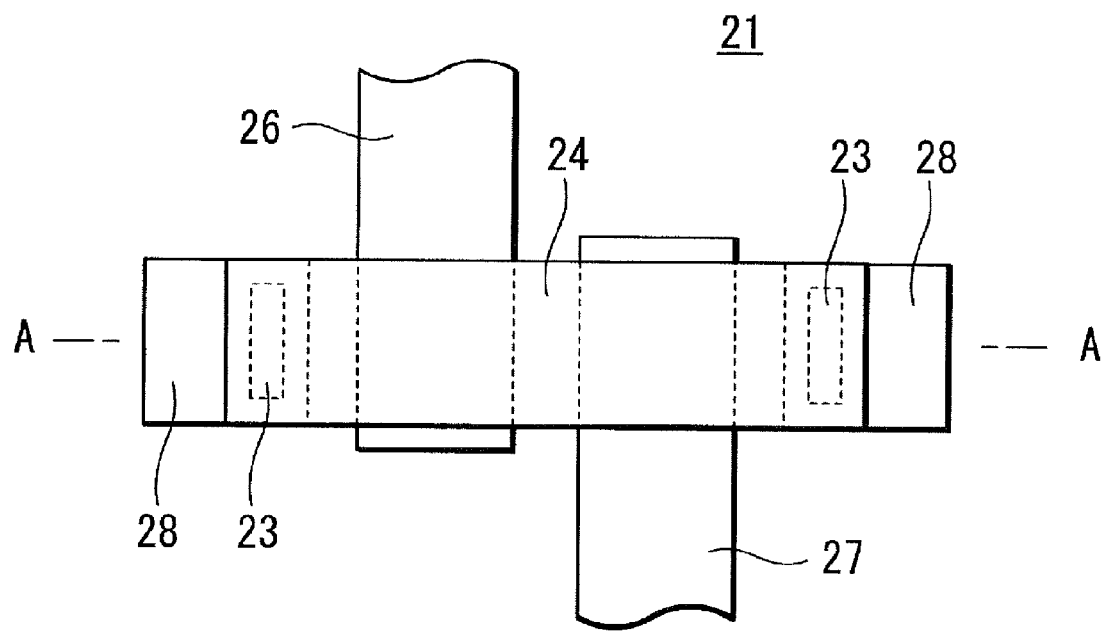
FIGS. 3A and 3B are a plan view illustrating an example of a unit resonator element adapted to a resonator according to an embodiment of the present invention, and a cross-sectional view taken along the line A-A of the structure of FIG. 3A, respectively.
Figure 3B:
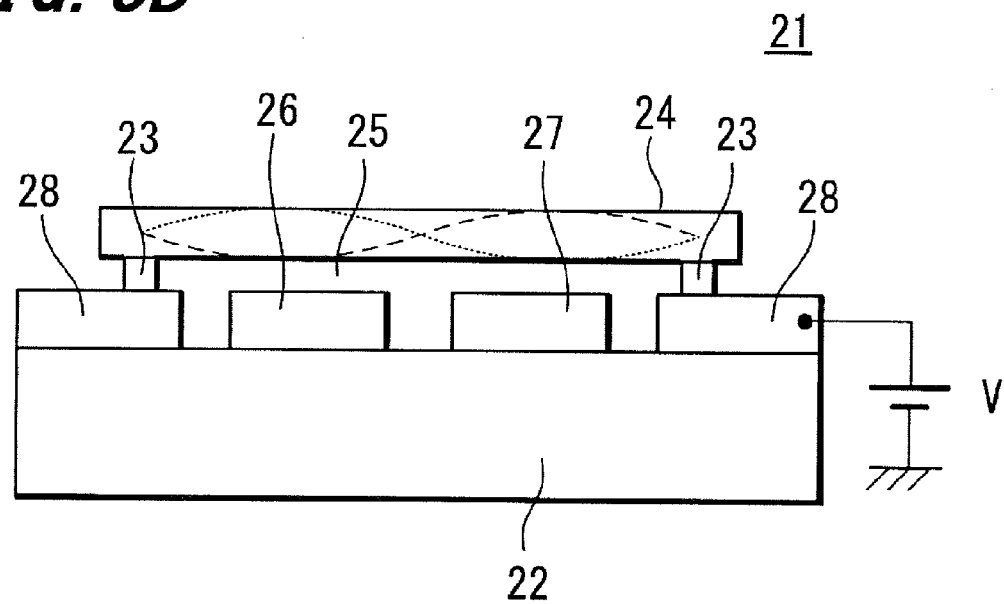

First, the configuration and operating principles of a single resonator element forming a resonator are described in details with reference to FIGS. 3A and 3B, according to a first embodiment of the invention. The resonator element of the embodiment is a micro scale or nano scale micro resonator element. The resonator element 21, as an example of the embodiment, is a mechanical resonator element including an oscillation part (so-called beam) 24 utilized as an oscillator held in the air by supporting parts 23 disposed at the both ends of a substrate 22, and an input electrode (so-called input signal line) 26 and an output electrode (so-called output signal line) 27 used as lower electrodes disposed on the substrate 22 so as to intersect the oscillation part 24 with a space 25 intervening therebetween, as described above. The supporting parts 23 are each formed to be connected to conductive seats 28 disposed on the substrate 22.

The oscillation part 24 applied with a direct-current (DC) bias voltage V by the signal input from the input electrode 26 is exerted by an external force owning to electrostatic field, and hence the oscillations of oscillation part 24 are caused at its characteristic resonance frequency in the resonator element 21. The oscillations are transmitted through the minute space 25 as signals to the output electrode 27. This resonator element 21 is one utilizing flexural oscillations of the secondary mode.

Figure 4:
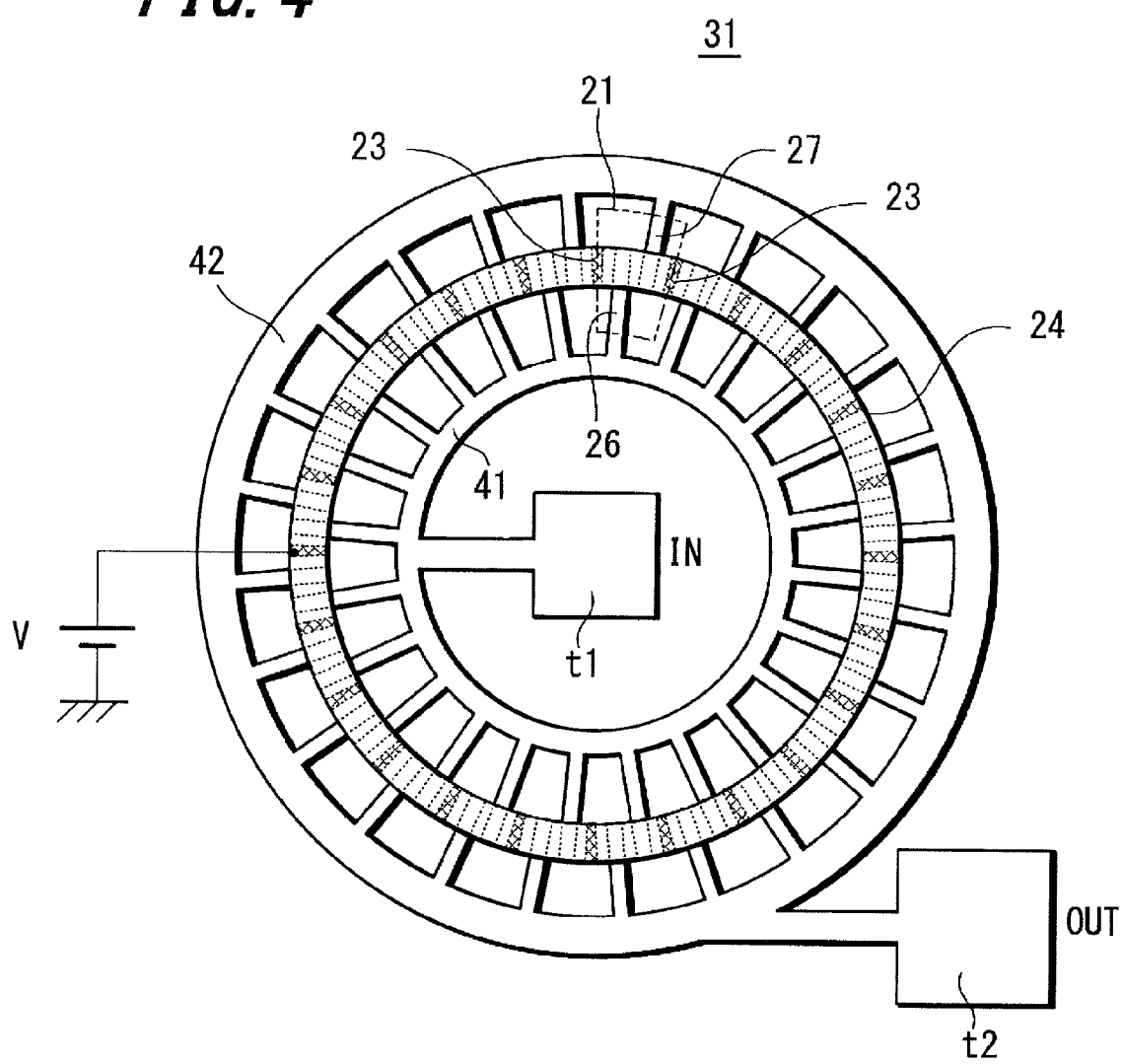
FIG. 4 is a schematic plan view illustrating a resonator according to a first embodiment of the invention.
Figure 5:
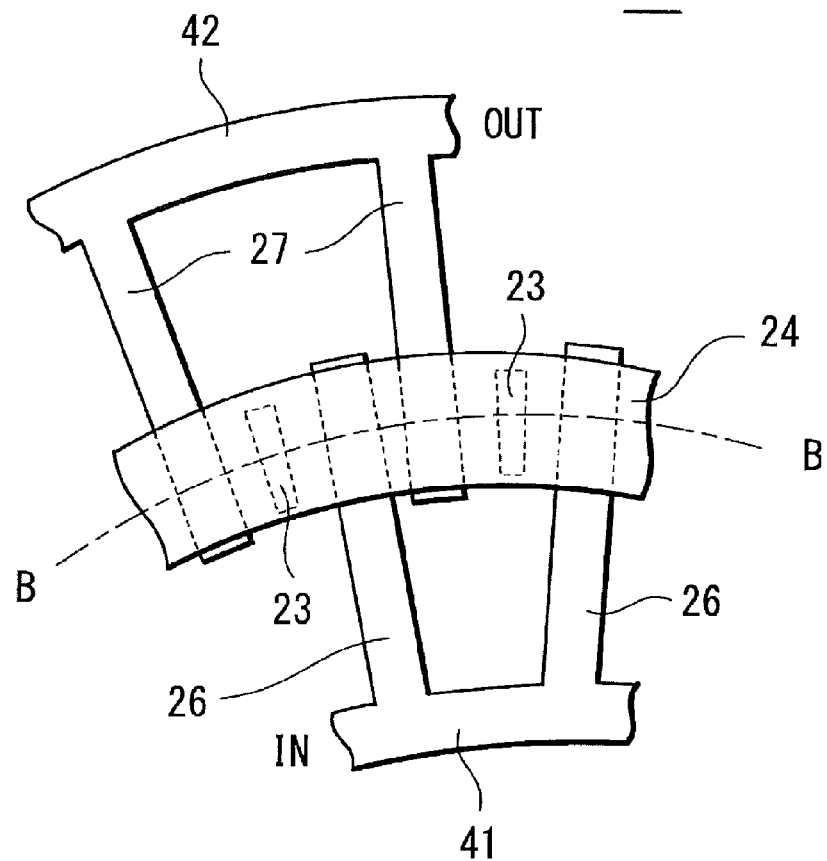
FIG. 5 is an enlarged view illustrating the principal part of the resonator of FIG. 4.
Figure 6:
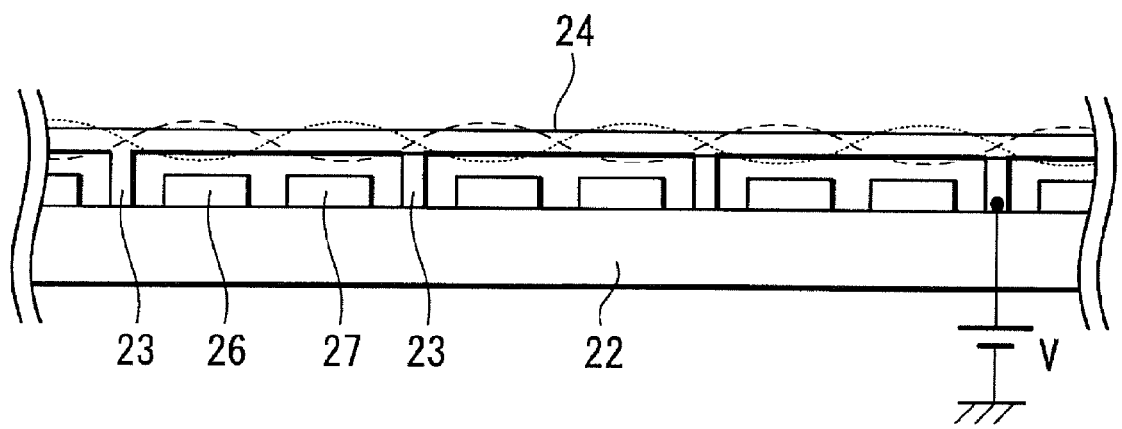
FIG. 6 is a cross-sectional view illustrating the resonator according to a first embodiment of the invention, taken along the line B-B of the structure of FIG. 4.

FIGS. 4 through 6 show a resonator as a so-called parallel resonator according to a first embodiment of the invention. The drawings schematically illustrate the configuration of the resonator, in which FIG. 4 is a plan view of the resonator as a whole, FIG. 5 is a plan view of a unit resonator element included in the resonator, and FIG. 6 is a view illustrating several unit resonator elements (cross-section taken along the line B-B of the structure of FIG. 5).

The resonator 31 according to the first embodiment includes a plurality of the aforementioned resonator elements 21 arranged on the substrate 22 to form a closed arrangement, and forming the oscillation parts 24 of the plurality of the resonator elements 21 continuously as an integrated structure. At least the portions of the substrate 22, on the upper face of which the lower electrodes are disposed, are formed of insulative base. For example, used as the insulative base are a semiconductor substrate formed thereon with an insulating film, an insulating glass substrate, and the like. All the resonator elements 21 in the parallel arrangement are formed being shaped like a ring having point symmetry with respect to the center of the closed arrangement, such as a circular ring in the present example. In this case, the continuous and integrated structure in the closed arrangement of the oscillation parts 24 is also formed as another circular ring.

That is, the plurality of the resonator elements 21 are arranged so that loops and nodes of the oscillation of the oscillation parts 24 are distributed to be disposed by turns in line and circularly as well. The input electrode 26 of each resonator element 21 is connected to a first concentric wiring 41 which is formed either inside of, or outside of the circular oscillation parts 24, i.e., inside in the present example (so that the wiring 41 together with the input electrode 26 is formed as the input signal line). The output electrode 27 of each resonator element 21 is connected to a second concentric wiring 42 which is formed either outside of, or inside of the circular oscillation parts 24, i.e., outside in the present example (so that the wiring 42 together with the output electrode 27 is formed as the output signal line). An electrode pad such as an input terminal t1 is inwardly lead out from the first concentric wiring 41 on the input side, while another electrode pad such an output terminal t2 is outwardly lead from the second concentric wiring 42 on the output side.

In addition, the circularly closed oscillation parts 24 are formed so that the loops and nodes of the oscillation are respectively disposed at uniform intervals. The length of the circularly closed oscillation parts 24 is therefore equal to an integral multiple of the wavelength of the oscillation. That is, the oscillation parts 24 are formed in a circularly connected shape so that even numbers of, as well as equal numbers of, the loops and nodes of the oscillation are included.

The supporting parts 23 for supporting the oscillating parts 24 in a continuous and integrated structure are each disposed at nodal points of oscillation. As illustrated in FIG. 6, the supporting parts 23 according to the embodiment are disposed on the both sides of the intervening input and output electrodes, 26 and 27, of the unit resonator element, i.e., at every other nodal point of the oscillation. For purposes of clarity of the schematic drawing, there abbreviated in FIG. 6 are the seats 28 connected to the supporting parts 23 shown in FIG. 3. The formation of the supporting parts 23 is not limited at every other nodal point of the oscillation, as aforementioned, and may also be carried out at suitable points such as, for example, at every nodal point or at every three or more nodal points, as long as the oscillation parts 24 is formed with sufficient strength, i.e., strong enough to prevent the oscillation parts 24 from contacting with the output electrodes 26 and 27.

Incidentally, the resonator 31 according to the embodiment is constructed to form the circular ring structure by connecting twenty-four unit resonator elements 21 shown in FIG. 3, for example.

The resonator 31 according to the first embodiment includes the resonator elements 21 arranged to form a circular ring such that the positional relationship between each of the unit resonator elements 21 and the parallelized resonator 31 as a whole is essentially the same, and structural irregularity due to the arrangement of the resonator elements 21 will not arise in this resonator. In addition, the stress exerted onto each unit resonator element 21 included in the oscillating part 24 is equal for all the resonator elements. Therefore, the variability in the characteristic between resonator elements can be suppressed, and the decrease in Q value due to parallelization can also be suppressed. Consequently, the Q value equivalent to that of the unit resonator can be obtained.

In addition, as shown in FIG. 4, since the oscillation parts 24 of the plurality of the resonator elements 21 circularly disposed, are formed as the continuously integrated structure, the number of the supporting parts 23 relative to that of the loops of vibration decreases, and the kinetic energy of oscillation which leaks out to the side of the substrate 22 through the supporting parts 23 decreases. Namely, some parts of the kinetic energy, which otherwise leaks to the substrate side, may affect on the oscillation of neighboring resonator elements 21.

Still in addition, since the plurality of resonator elements 21 are formed as a circular ring having point symmetry to the center of the circle, together with the abovementioned continuously integrated structure of the oscillation parts 24, the resonator 31 as a whole may generate the oscillations of higher modes, the kinetic energy thereof is transmitted to neighboring resonator elements 21, and the kinetic energy leaking out to the side of the substrate 22 can be reduced on the whole. As a result, Q value of the parallel resonator can be increased.

Since the length of the oscillation parts 24 is brought to be equal to an integral multiple of the wavelength of the oscillation, the resonator 31 can be render to the oscillations of higher modes. The supporting parts 23 for the oscillating parts 24 are disposed at nodal points of the oscillation, and hence higher mode oscillations can be obtained.

Figure 1B:
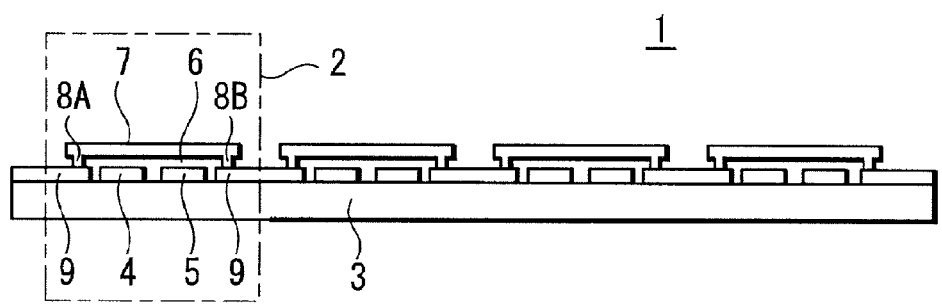
Figure 2:
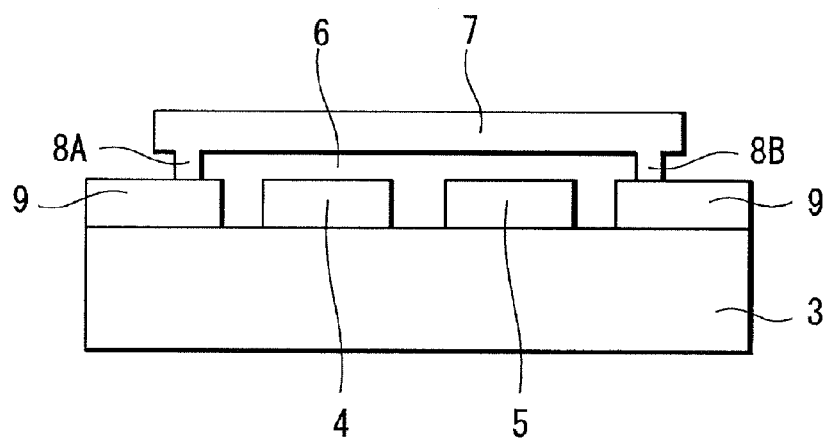
FIG. 2 is a cross-sectional view illustrating a unit resonator element included in the parallel resonator of FIGS. 1A and 1B.
Figure 7B:
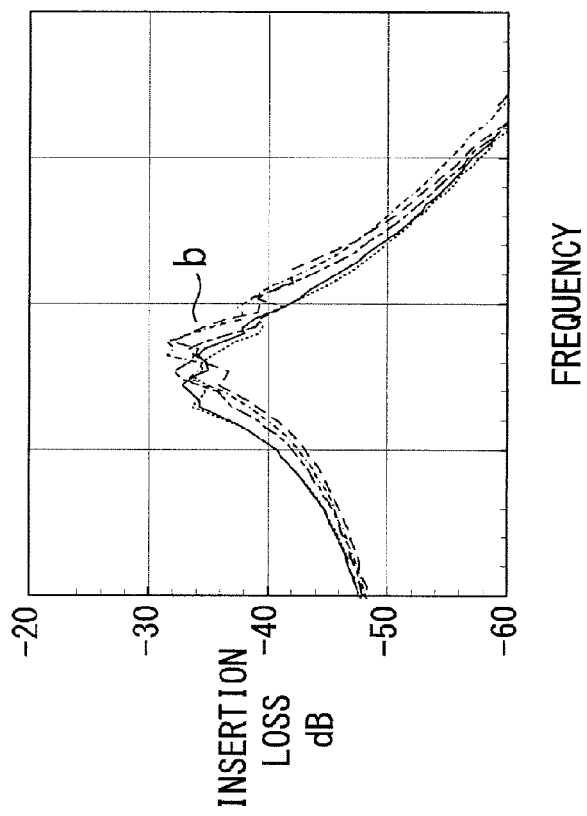
FIGS. 7A and 7B are graphical plots respectively illustrating resonance characteristics for making a comparison between a circular ring parallel resonator according to an embodiment of the present invention and an parallel resonator in an arrayed structure.
Figure 7A:
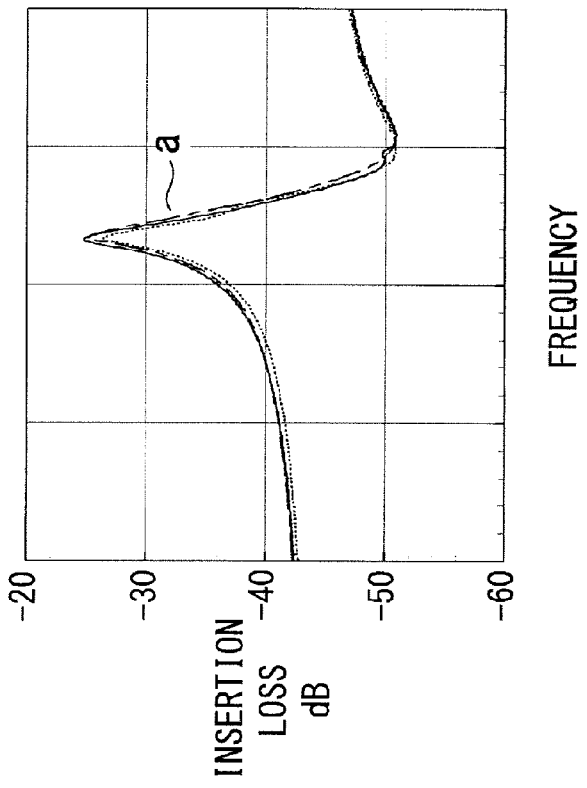

FIGS. 7A and 7B are graphical plots of resonance characteristics for making a comparison between the circular-shaped parallel resonator 31 according to the first embodiment and the parallel resonator 1 in an arrayed structure according to the comparative example shown in FIGS. 1A and 1B. FIG. 7A illustrates the resonance characteristics "a" for the parallel resonator 31 of the first embodiment, while FIG. 7B illustrates the characteristics "b" for the parallel resonator 1 of the comparative example. FIG. 7A shows the characteristics obtained for the sample resonator which includes resonator elements with the number of parallelization being 32, while FIG. 7B shows the characteristics obtained for the further sample resonator which includes resonators with the number of parallelization being 30.

When the parallel arrangement is formed as the abovementioned arrayed structure in order to reduce the insertion loss for resonance peaks, the peak splitting arises, and the decreases in, as well as large variability of, the Q value are generated (refer to FIG. 7B). For the parallelization with the circular ring arrangement in the embodiment, the peak splitting almost disappears, and the decreases and the variability for the Q value are reduced considerably (refer to FIG. 7A).

Figure 8:
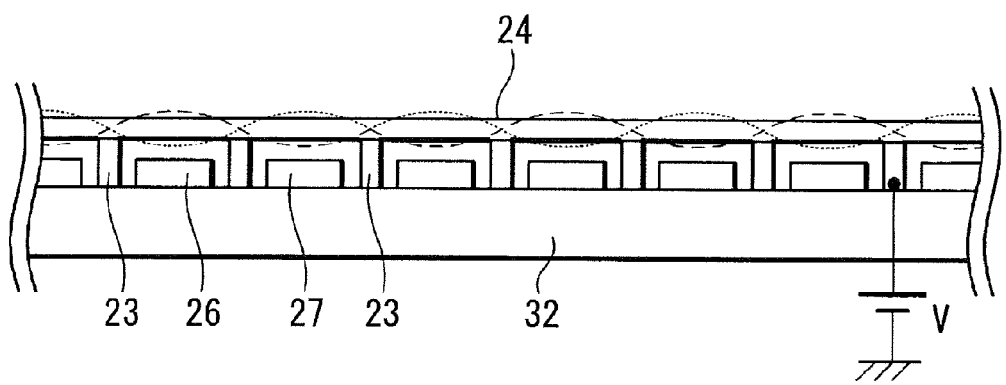
FIG. 8 is a schematic plan view illustrating a resonator according to a second embodiment of the invention.

FIG. 8 shows a resonator, specifically, a parallel resonator according to a second embodiment of the invention. The resonator 55 according to the second embodiment is formed at least by disposing the supporting parts 23 at every nodal point of the oscillation. Since the components and other features such as the input electrode 26 of the unit resonator element 21, the output electrode 27, and the oscillation parts 24, other than the supporting parts 23, are similar to those FIGS. 4 and 6 according to the first embodiment, the components corresponding to FIG. 6 are indicated with identical numerals and the repeated description thereof is herewith abbreviated. With regard to the resonator 55 according to the second embodiment, the supporting parts 23 are disposed at every nodal point of the oscillation, so that the resonance mode is limited and the accuracy of the Q value increases. In addition, this configuration can provide advantageous effects similar to those aforementioned in the first embodiment.

Figure 9A:
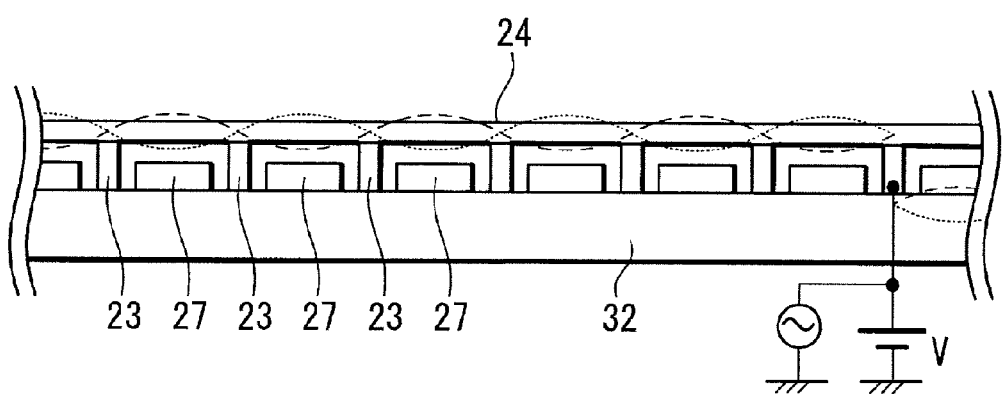
FIGS. 9A and 9B are a schematic plan view illustrating a resonator according to a third embodiment of the invention, and a cross-sectional view illustrating a unit resonator element included in the resonator, respectively.
Figure 9B:
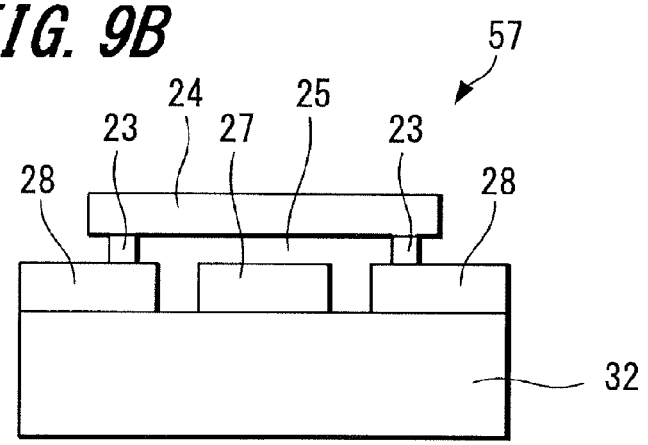

FIGS. 9A and 9B show a resonator, specifically, a parallel resonator according to a third embodiment of the invention. The resonator 56 according to the third embodiment is formed at least by arranging only the output electrodes 27 as lower electrodes, and disposing the supporting parts 23 at every nodal point of the oscillation (corresponding to every other loop of the oscillation) of the oscillation parts 24 in a manner so as to place each output electrode 27 between the supporting parts 23. In the embodiment there inputted through the supporting parts 23 to the oscillation parts 24 are DC bias voltage V as well as input signals. In this case, the supporting parts 23 (or oscillation parts 24) serve also as input electrodes.

In the third embodiment, the unit resonator element 57 is formed with one output electrode 27 and the oscillation part 24 supported by the supporting parts 23 on both sides, and a plurality of unit resonator elements 57 are disposed in the circular ring arrangement. Since other components and features such as the oscillation parts 24 and others are similar to those of FIGS. 4 and 6 according to the first embodiment, the components corresponding to FIG. 6 are indicated with identical numerals and the repeated description thereof is herewith abbreviated. With regard to the resonator 56 according to the third embodiment, advantageous effects are also provided similar to those aforementioned in the first embodiment.

Figures 10A, 10B:
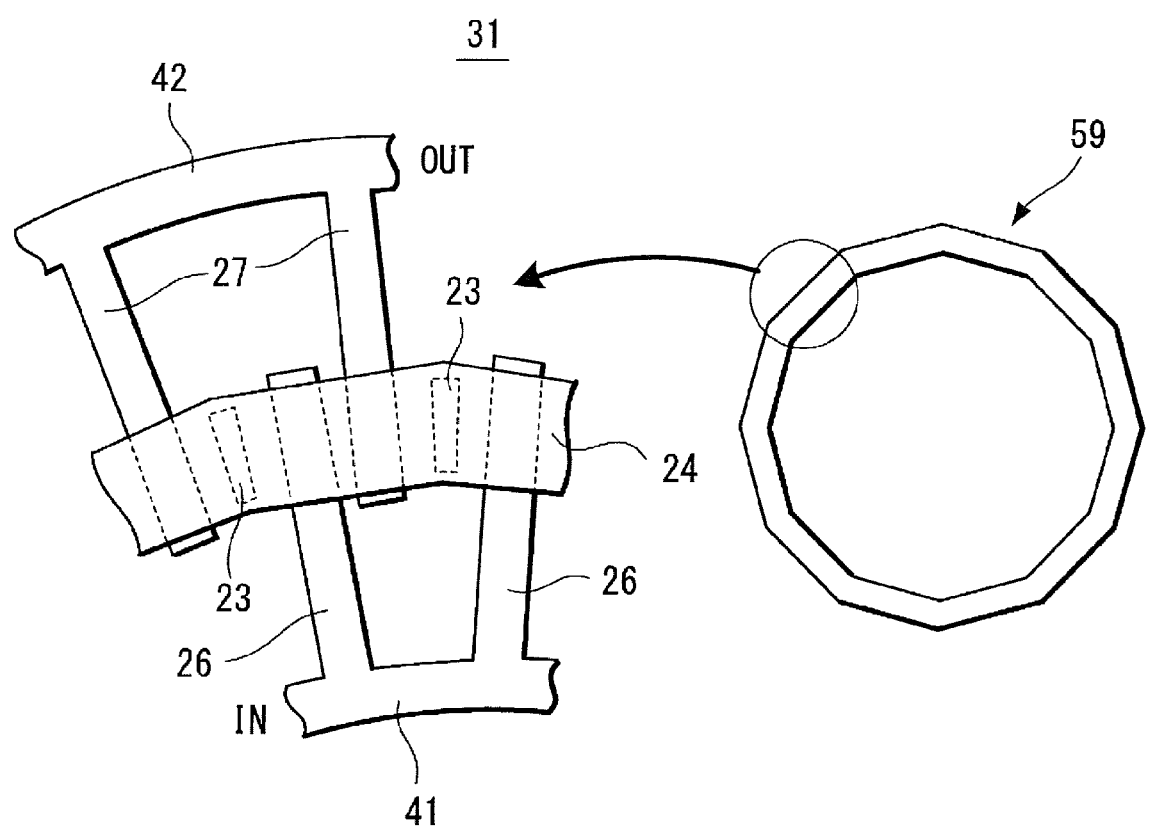
FIGS. 10A and 10B are a schematic plan view illustrating the principal portion of a resonator according to a fourth embodiment of the invention, and a schematic view illustrating a polygonal ring structure of the resonator including the principal portion, respectively.

FIGS. 10A and 10B show a resonator, specifically, a parallel resonator according to a fourth embodiment of the invention. The resonator 59 according to the fourth embodiment is formed by connecting unit resonator elements 21 to form polygon during the arrangement for forming the circular arrangement. Examples of the polygon include even-numbered regular polygons such as a regular hexagon, a regular octagon, and the like. Since the components and other features other than the polygon arrangement are similar to those of FIGS. 4 through 6 according to the first embodiment, the components corresponding to FIGS. 4 through 6 are indicated with identical numerals and the repeated description thereof is herewith abbreviated. With regard to the resonator 59 according to the fourth embodiment, advantageous effects are also provided similar to those aforementioned in the first embodiment.

Figure 11A:
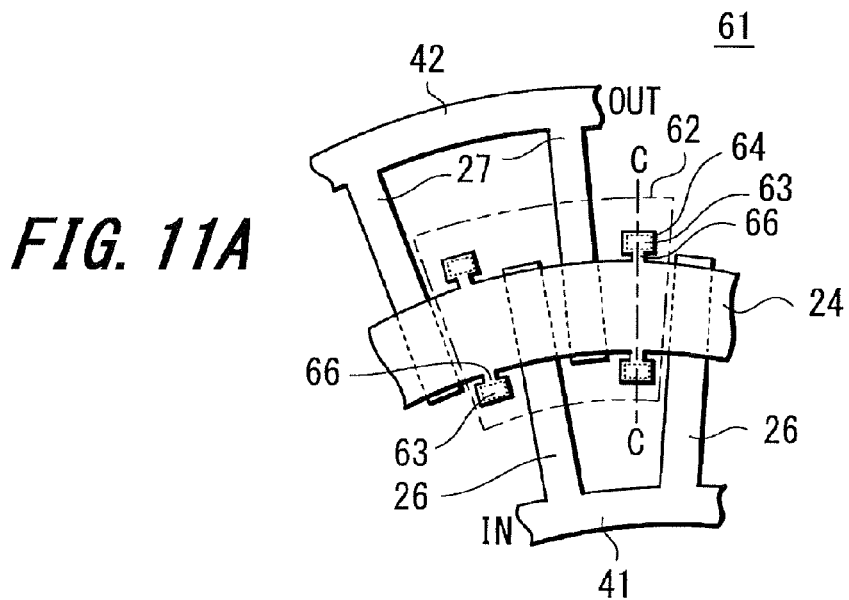
FIGS. 11A, 11B, and 11C are a plan view illustrating another example of a unit resonator element adapted to a resonator according to an embodiment of the present invention, a cross-sectional view illustrating the unit resonator element taken along the line C-C of the structure of FIG. 11A, and an enlarged view illustrating a portion of the resonator including supporting parts, respectively.
Figure 11B:
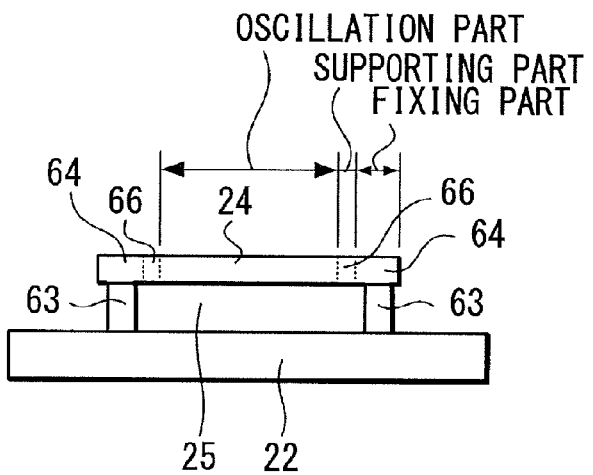

The resonators in the abovementioned embodiments are formed by disposing the supporting parts 23 for supporting the oscillating parts 24 included in the resonator elements under the oscillation parts 24. FIGS. 11A and 11B illustrate other configurations of the resonator using different supporting means for supporting the oscillation parts in the resonator.

Figure 11C:
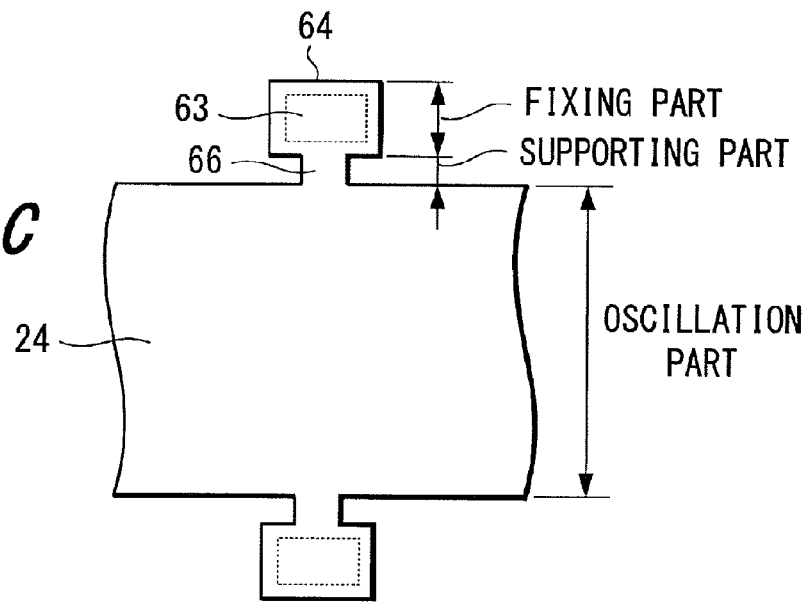

As shown in FIGS. 11A, 11B, and 11C, the resonator 61 according to the embodiment is formed by (a) including resonator elements 62, each provided with an oscillation part 24; supporting parts 66 for fixing the oscillating part 24 to a substrate 22 through first and second fixing parts, 63 and 64; and an input electrode 26 and an output electrode 27 for allowing electric signals, each formed on the substrate 22 facing the oscillation part 24 with intervening a minute space 25 therebetween; and (b) arranging the resonator elements 62 so that the supporting parts 66 are disposed outside the oscillation part 24. The reference numerals 41 and 42 indicate the input side, and output side wirings, respectively.

The supporting parts 66 are each formed outside the oscillation parts 24 as a structure continuously integrated with the supporting parts. The second fixing parts 64 are each formed outside of the supporting parts 66 as another structure being continuously integrated therewith and protruded therefrom, and the first fixing parts 63 are each disposed under the second fixing parts 64. The fixing parts 63 are each fixed onto conductive seats 81 which are formed on the substrate 22 in simultaneous with the input and output electrodes, 26 and 27, as the lower electrodes.

It is noted herein that the supporting parts 66 and the fixing parts 64 are each formed as continuously integrated structures protruding from the oscillating parts 24 as protruding portions. It follows that the fixing parts for the supporting parts 66 are formed of three components, i.e., conductive seats 81, and first and second fixing parts 63 and 64.

The position of the support parts 66 is disposed at the nodal point of the oscillation which is generated during the resonance of the oscillation parts 24 i.e., at the location where the oscillations are hardly generated. The position, size, and rigidity of the supporting part 66 and the fixing part 64 are determined so that the both ends of the oscillating part 24 may serve as free ends of the oscillation.

In the resonator 61 according the embodiment, there is extremely little leak of the oscillation energy from the oscillating parts 24 to the substrate 22 compared with the resonator formed by disposing the supporting parts 23 under the oscillating part 24. In addition, since the supporting parts 66 are each disposed at the nodal points of oscillation in a similar manner to those in the aforementioned embodiments, the present structure has the advantage of hardly transferring the oscillation energy to the supporting parts 66.

In the embodiment, the resonators utilizing the resonator elements 62 of FIGS. 11A, 11B are described according to a further embodiment of the invention.

Figure 12A:
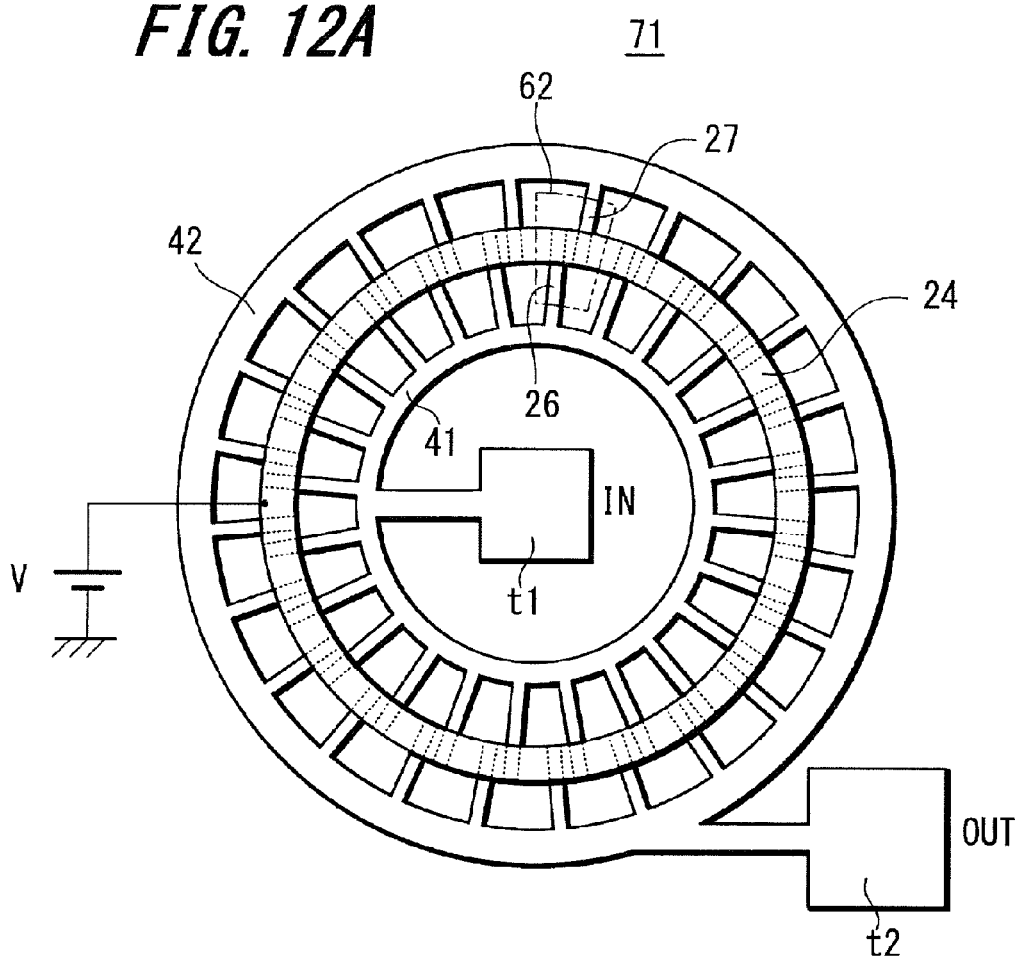
FIGS. 12A and 12B are a schematic plan view illustrating a resonator according to a fifth embodiment of the invention, and an enlarged view illustrating the principal part of the resonator, respectively.
Figure 12B:
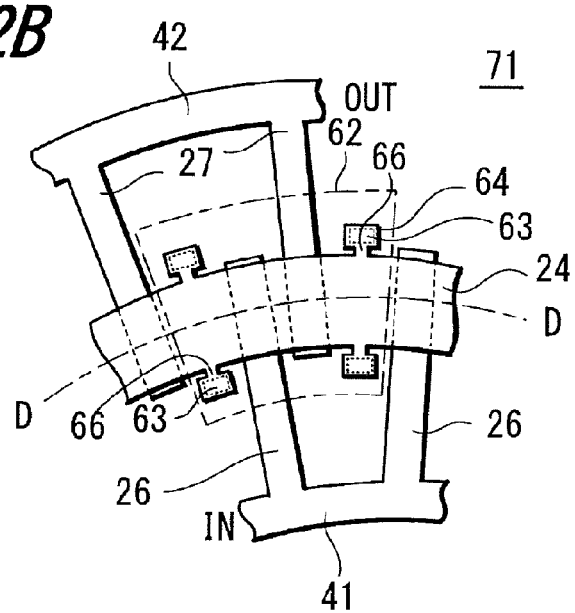
Figure 13:
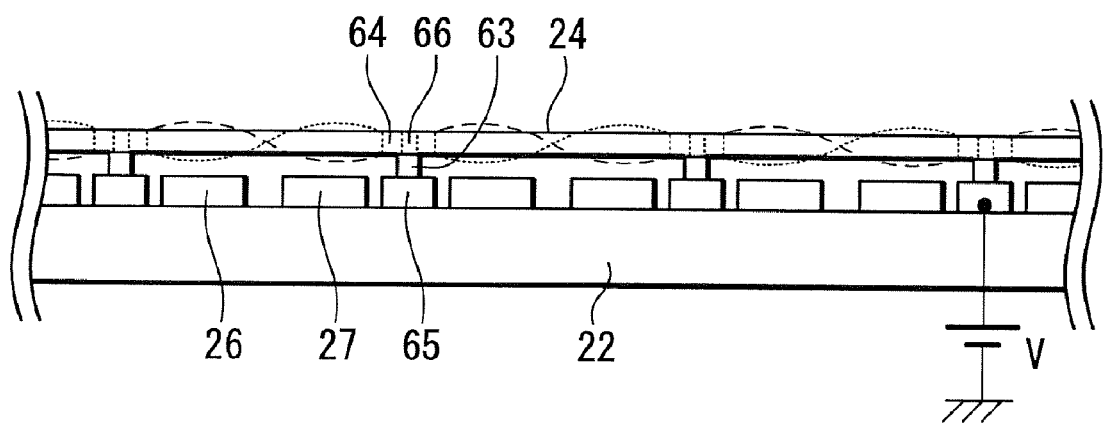
FIG. 13 is a cross-sectional view illustrating the resonator according to the fifth embodiment of the invention, taken along the line D-D of the structure of FIG. 12B.

FIGS. 12A, 12B, and 13 show a resonator, specifically, a parallel resonator according to a fifth embodiment of the invention. The drawings schematically illustrate the configuration of the resonator, in which FIG. 12A is a plan view of the resonator as a whole, FIG. 12B is a plan view of a unit resonator element included in the resonator, and FIG. 13 is a cross-sectional view of the resonator (the cross-section taken along the line D-D of the structure of FIG. 12A).

The resonator 71 according to the fifth embodiment is formed by arranging a plurality of the abovementioned resonator elements 62 on the substrate 22 to be in a closed arrangement, and forming oscillation parts 24 of the plurality of the resonator elements 62 continuously to be an integrated structure. At least the portions of the substrate 22, on the upper face of which the lower electrodes are disposed, are formed of insulative base, similarly to the embodiments described earlier. For example, used as the insulative base are a semiconductor substrate formed thereon with an insulating film, an insulating substrate, and the like. All the resonator elements 71 in the parallel arrangement are formed to be in a circular ring structure having point symmetry with respect to the center of the closed system, such as a circular ring in the present example. The continuous and integrated structure in the closed arrangement of the oscillation parts 24 is therefore formed to be a circular ring.

In addition, according to the embodiment, supporting parts 66 for supporting the oscillation parts 24 are disposed on both outsides of, or on the inner as well as outer circumferences of, the oscillating part 24, and at the locations each corresponding to every other nodal point of the oscillation, i.e., at every nodal point being one wavelength apart with each other of the secondary mode oscillation. Namely, as mentioned earlier, the supporting parts 66 are disposed outside the oscillation parts 24 so as to form a structure which is continuously integrated with, and connected from both sides of, the oscillation parts 24. In this example, four supporting parts 66 are provided for each unit resonator element. The supporting parts 66 serve as the support for the oscillation parts 24, and are each fixed through the fixing parts, 63 and 64, onto conductive seats 65 which are formed on the substrate 22 in simultaneous with the input and output electrodes, 26 and 27, as the lower electrodes.

Figure 14:
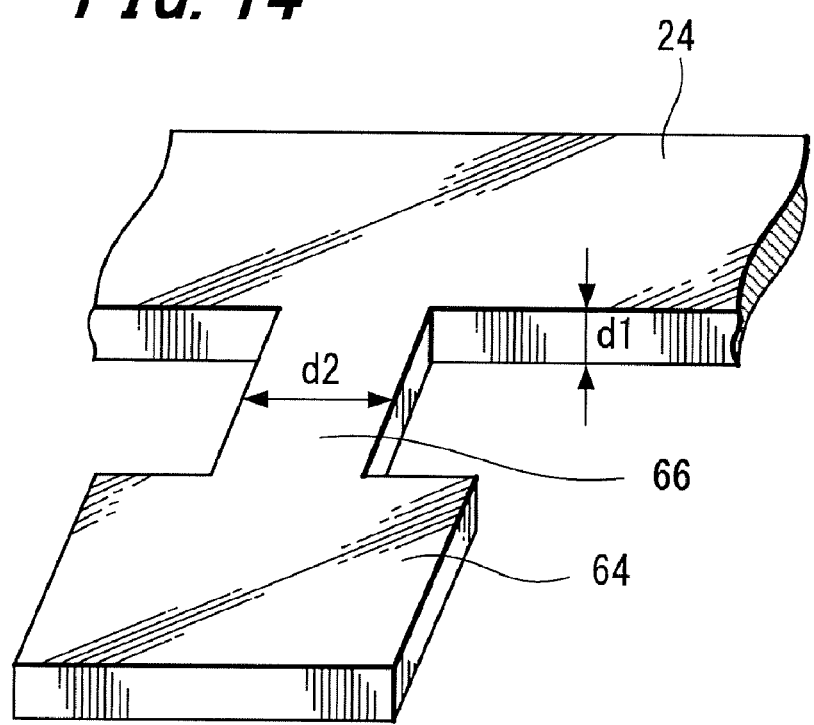
FIG. 14 is a perspective view illustrating a protruding portion formed integrally with the oscillation part as a continuous structure serving as a support according to an embodiment of the present invention.

As shown in FIG. 14, the portion in the supporting part 66 which serves as the support for the oscillating part 24 is the portion adjacent thereto. The supporting part 66 is formed with the fixing part 64 as a continuous structure. The portion, which protrudes outward from the oscillating parts 24, i.e., protruding portion, is formed having the shape of the relatively narrow supporting part 66 continuously connected to the wide fixing part 64. The supporting part 66 and the oscillating part 24 are formed as a continuous and integrated structure, and the width d2 of the former is preferably made equal to the film thickness d1 of the latter (the film thickness of the protruding portion formed with the supporting part 66 and the fixing part 64), i.e., d1=d2.

Namely, it is desirable that the shape of the cross section of narrow width portion 64A is a square. In this case, the protruding portion formed with the supporting part 66 and the fixing part 64 is formed on the same plane as the oscillation part 24. When the supporting part 66 and the fixing part 64 are formed on the same plane as the oscillation part 24, the mechanical loss at the joint of the supporting part 66 and the oscillation part 24 can be minimized. Consequently, the Q value of the oscillator can be retained high.

If d1=d2 is determined, the torsional movement of the supporting part 66 is smooth, which is incurred in concomitant with the oscillation of the oscillation part 24, and that the Q value stably increases. For too broad widths d2 of the narrow width portion 64A, the torsional movements are hard to be generated. For too narrow widths, in contrast, the movement observed is unstable, and stable Q values may no be obtained as a result. If the shape of the cross section of narrow width portion 64A is a square, the maximum point of the Q value is attained.

Since other components and features are similar to those described with reference to FIGS. 4 through 6, the details thereof are abbreviated. In addition, the components corresponding to those shown in FIGS. 4 through 6 are indicated with identical numerals and the repeated description thereof is herewith abbreviated.

In the resonator 71 according to the fifth embodiment, since the oscillations of higher modes are excited in terms of resonance wave number of the resonator element 62 as the unit. In addition, since the oscillation parts 24 are formed as the circular closed system, the oscillations of homogeneous modes can be generated. In this closed system, the distance between the nodes is equal to that between the loops, for the oscillation in each resonator element 62. Therefore, even if a comparison is made between any two resonator elements 62 in the closed system, resonator characteristics are found equal with each other, and no structural variability is found among the resonator elements 62. As a result, the variability in the characteristics of each resonator element 62 is suppressed, and high Q values for the resonator and the resonator with low insertion losses are obtained. Furthermore, since the supporting parts 63 for the oscillation parts 24 are disposed outside of the oscillation parts 24, the leak of oscillation energy to the side of the substrate 22, which normally takes place by way of the oscillation parts 24, protruding portions 64, supporting parts 63, and substrate 22, is now suppressed, and still higher Q values are obtained.

Figure 15A:
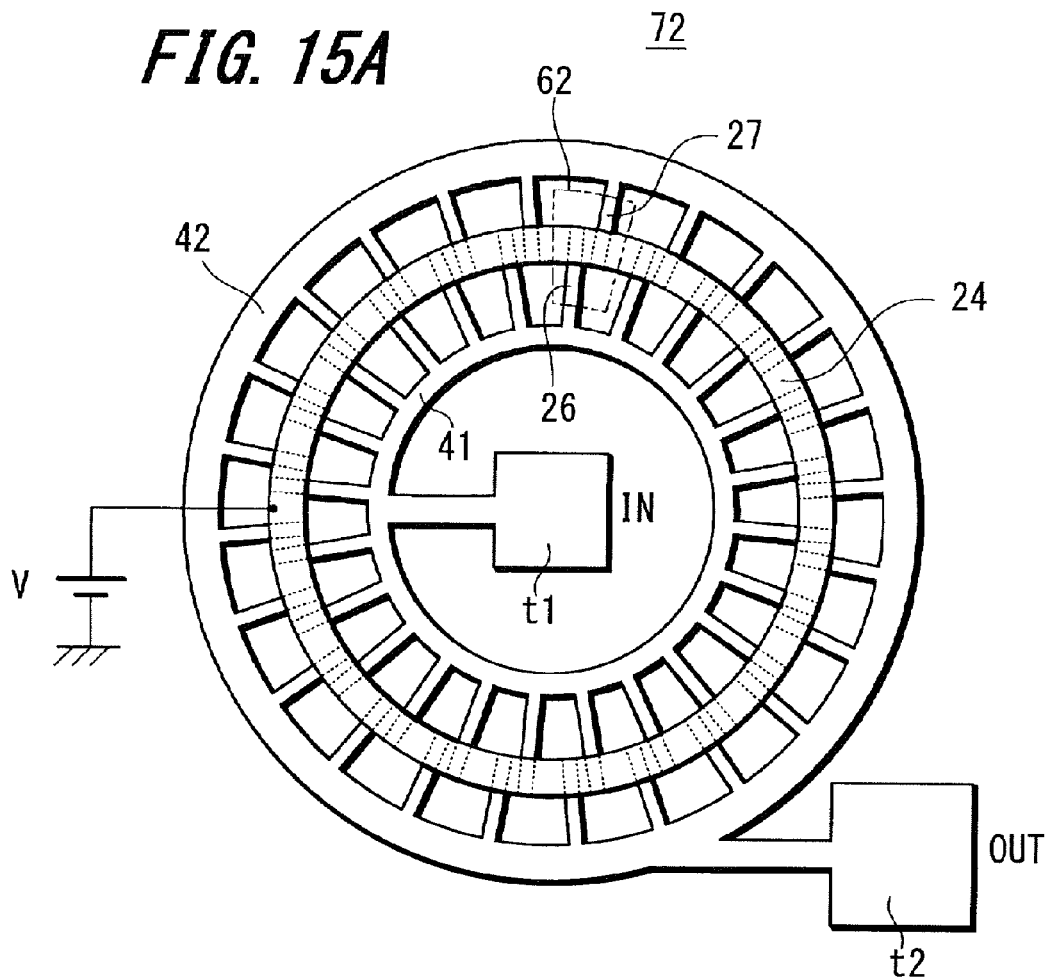
FIGS. 15A and 15B are a schematic plan view illustrating a resonator according to a sixth embodiment of the invention, and an enlarged view illustrating the principal part of the resonator, respectively.
Figure 15B:
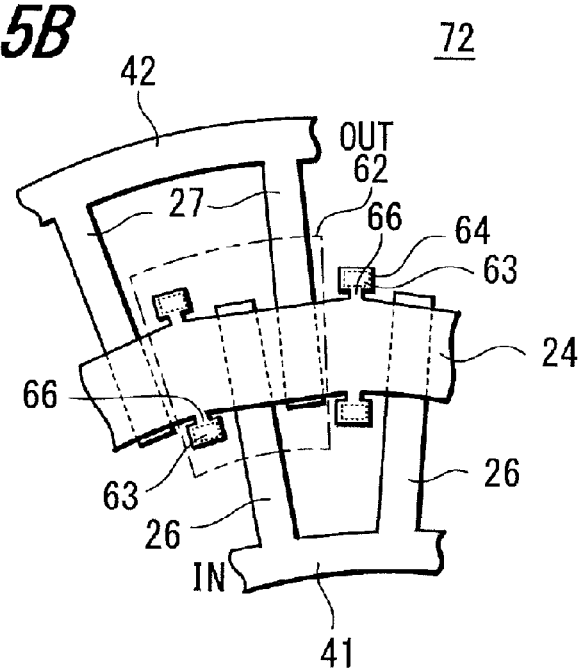

FIGS. 15A and 15B show a resonator, specifically, a parallel resonator according to a sixth embodiment of the invention. The resonator 72 according to the fourth embodiment is formed by connecting unit resonator elements 62 to form polygon during the connection for forming the circular structure. In this example, the oscillation parts 24 are formed as a polygonal closed system. In a manner similar to the aforementioned, examples of the polygon may include even-numbered regular polygons such as a regular hexagon, a regular octagon, and the like. Since the components and other features other than the polygonal arrangement are similar to those of FIGS. 12A and 12B according to the fifth embodiment, the components corresponding to FIGS. 12A and 12B are indicated with identical numerals and the repeated description thereof is herewith abbreviated.

In the resonator 72 according to the sixth embodiment, since its configuration is achieved by connecting the resonator elements 62 to be the polygonal closed system, the present configuration can provide advantageous effects similar to those aforementioned in the fifth embodiment. For example, since the shape of the resonator elements 62 is formed to be equal with each other, the variability in characteristics of each resonator element 62 is suppressed, and high Q values and low insertion losses are obtained. In addition, since the supporting parts 63 are disposed on both outsides of the oscillation parts 24, the leak of oscillation energy to the substrate 22 is reduced, and still higher Q values can be obtained.

Although the resonator elements 62 described in the fifth and sixth embodiments have been arranged under the conditions equivalent with each other, it is also possible to form a closed system as a resonator by combining nonequivalent resonator elements depending on the method of forming the closed system.

Figure 16A:
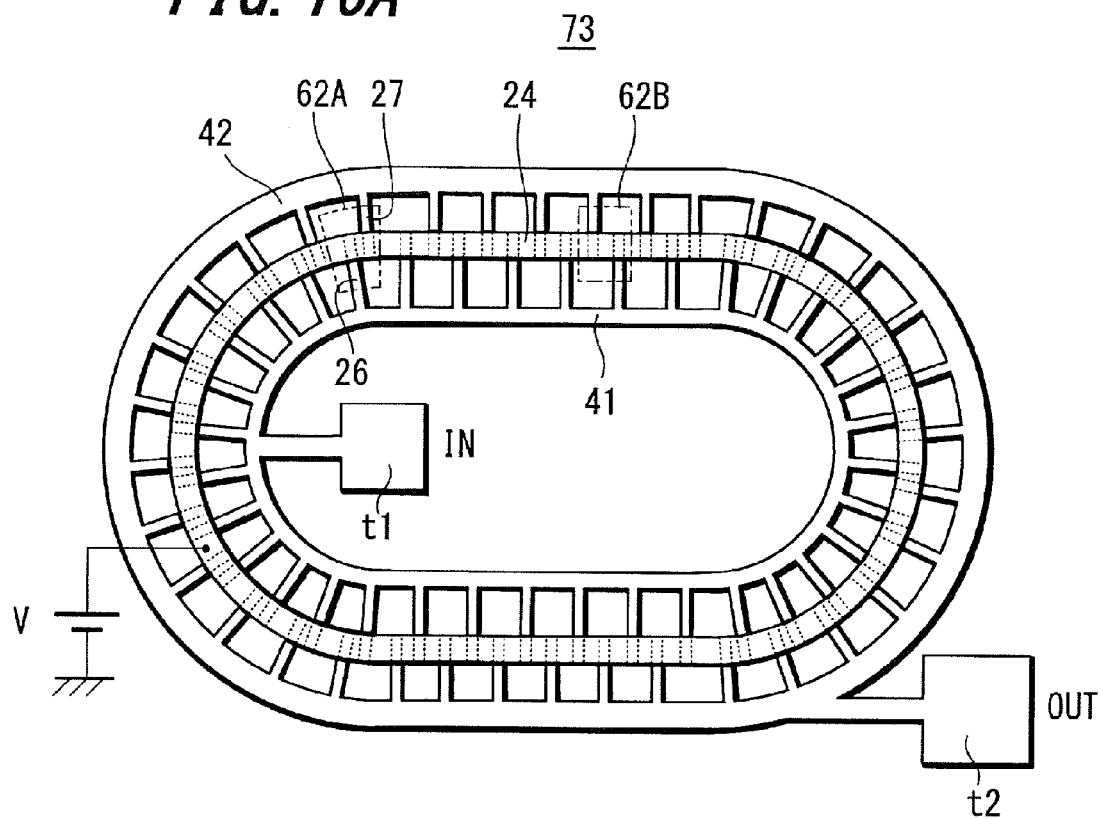
FIG. 16A is a schematic plan view illustrating a resonator according to a seventh embodiment of the invention.
Figure 16B:
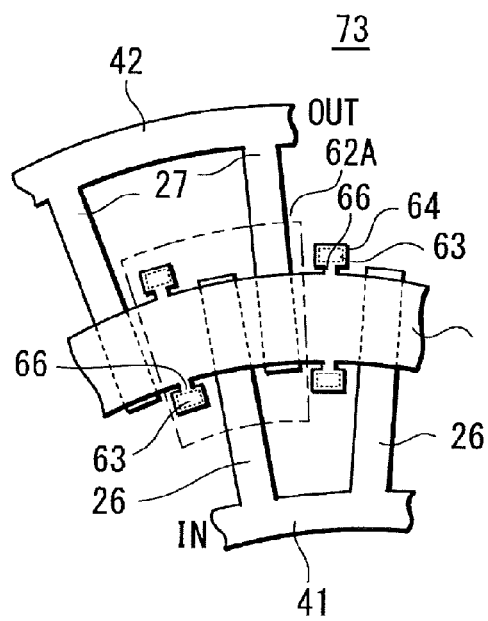
FIGS. 16B and 16C are enlarged views respectively illustrating the principal parts of two kinds of resonator elements to be included in the resonator of FIG. 16A.
Figure 16C:
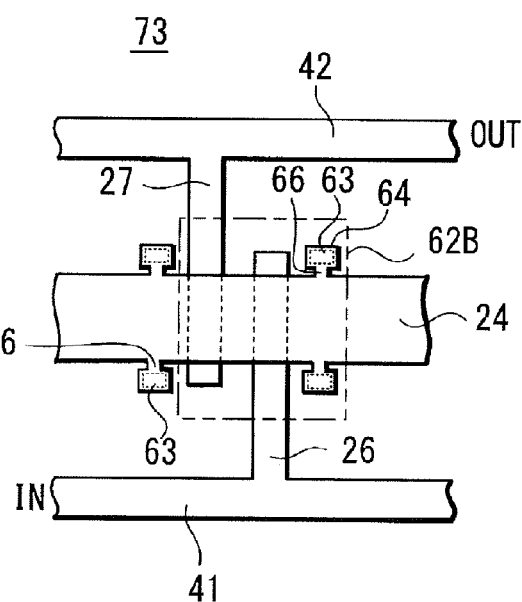

FIG. 16 shows a resonator formed by combining nonequivalent resonator elements, specifically, a parallel resonator according to a seventh embodiment of the invention. The resonator 73 according to the seventh embodiment is formed by combining two kinds of resonator elements 62A and 62B shown in FIGS. 16B and 16C, respectively, so as to form a closed system, and by disposing these resonator elements to form a track-shaped circular arrangement including straight lines and curves (e.g., arcs). The resonator elements 62A of FIG. 16B are disposed on curved portions of the loop, and formed as the curved structure similar to that shown earlier in FIG. 12B, in combination with the oscillation parts 24, a wiring 42 connected to output electrodes, and another wiring 41 connected to input electrodes. The resonator elements 62B of FIG. 16C are disposed on linear portions of the loop, and formed as a linear structure in combination with the oscillation parts 24, the wiring 42 connected to output electrodes, and the wiring 41 connected to input electrodes.

Since other components and features such as, for example, disposing the supporting parts 66 on both outsides of the oscillating part 24, are similar to those in the fifth embodiment, the components corresponding to FIGS. 12A, 12B are indicated with identical numerals and the repeated description thereof is herewith abbreviated.

In the resonator 73 according to the seventh embodiment, although the two resonator elements 62A and 62B mutually differ in the mode of the oscillation, these resonator elements can be designed to be equal in resonance frequency. As a result, when formed as the resonator, the oscillations of higher modes are excited in terms of resonance wave number of the resonator element as the unit in a manner similar to the fifth and sixth embodiments. In addition, since the oscillation parts 24 are similarly formed as the closed system, the oscillation can be generated in homogeneous oscillation modes with relative ease, and every resonator element in the closed system oscillates at the resonance frequency equal to each other.

Although the number of design factors for controlling the characteristics of two resonator elements 62A and 62B increases, more advantages can be provided for the resonator elements in the oscillation parts 24 utilizing linear resonator elements 62B. Since the structure of the linear oscillation parts 24 is similar both inside and outside of the closed system, the stress-strain calculation becomes easier for the structure than the case of the curved (arc-shaped) oscillation parts 24, and this makes it easier to manufacture the resonator structure. As a result, desirable frequency characteristics can be obtained more easily.

Accordingly, in the resonator 73 according to the seventh enforcement, it is preferable to include more linear portions than curved portions, and preferably for the linear portions to form as long as possible.

In addition, high Q values and low insertion loss are obtained also in the embodiment, as aforementioned. Still in addition, the leak of oscillation energy to the substrate 22 is suppressed, and still higher Q values are obtained.

Figure 17:
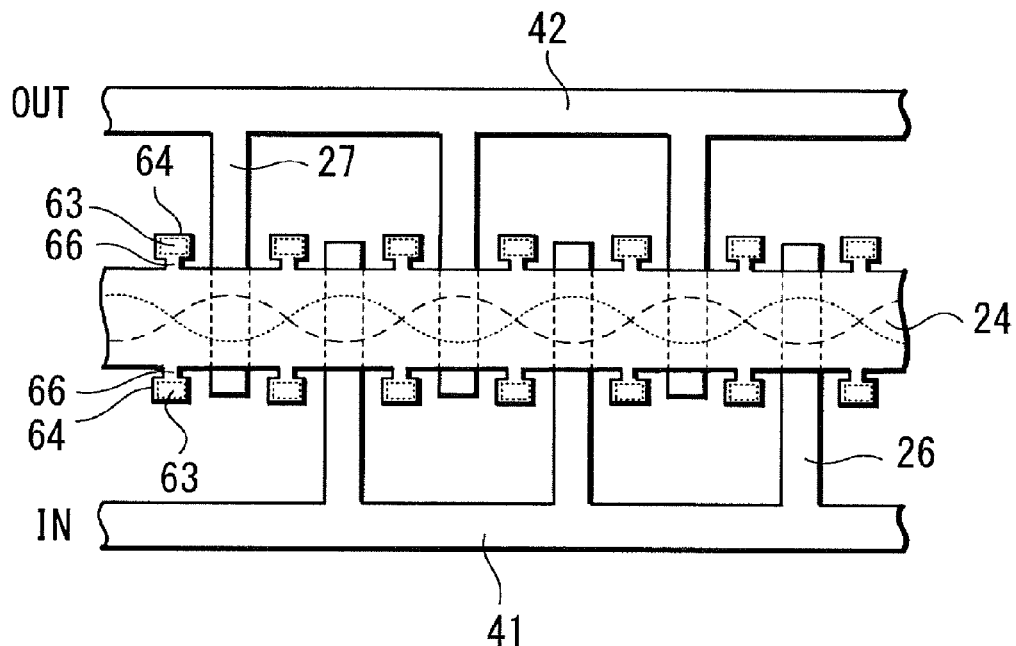
FIG. 17 is a configuration diagram illustrating an example of the method of supporting oscillation parts adapted to a resonator according to an embodiment of the present invention.
Figure 18:
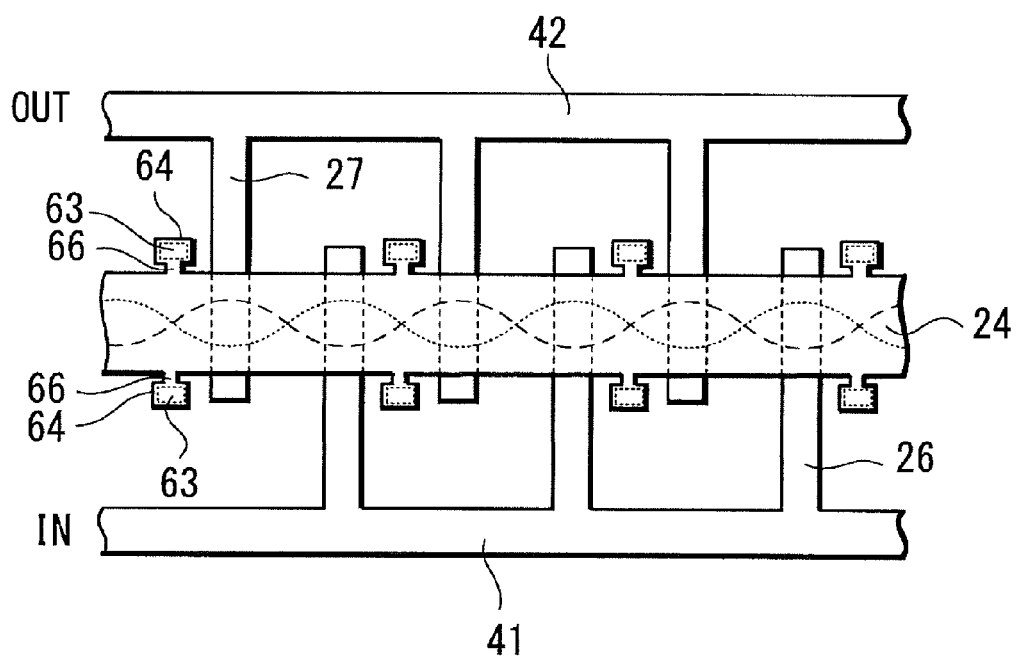
FIG. 18 is a configuration diagram illustrating another example of the method of supporting oscillation parts adapted to a resonator according to an embodiment of the present invention.
Figure 19:
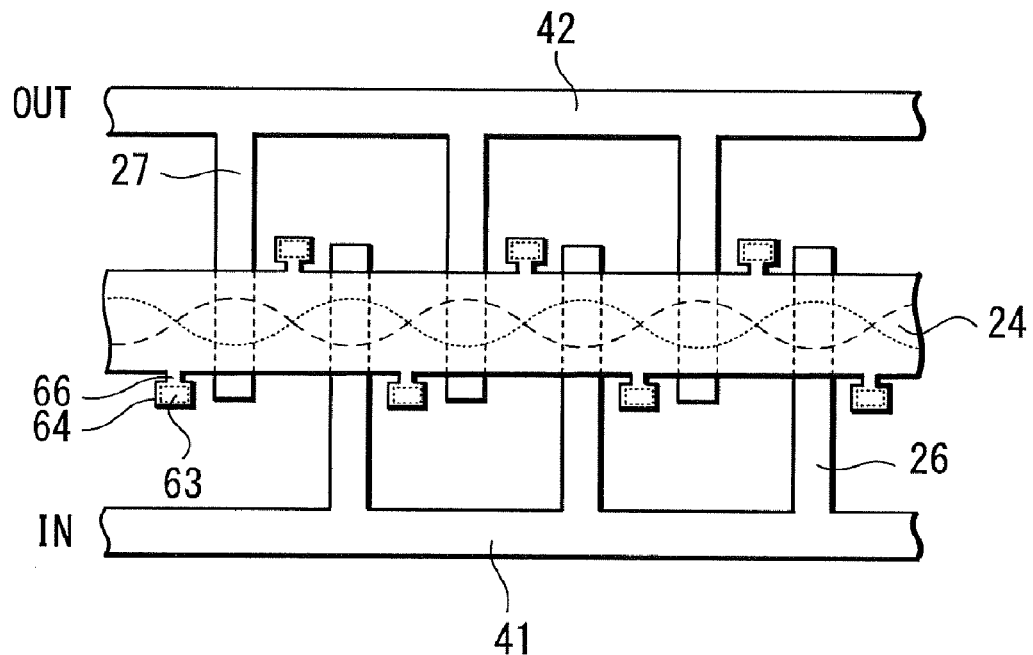
FIG. 19 is a configuration diagram illustrating still another example of the method of supporting oscillation parts adapted to a resonator according to an embodiment of the present invention.

Referring now to FIGS. 17 through 19, there illustrated are the methods of supporting the oscillation portions, i.e., examples of the location for disposing the supporting parts, which can be adapted to the resonators according the fifth through seventh embodiments. Incidentally, the components and portions corresponding to the fifth through seventh embodiments are indicated with identical numerals.

In the supporting method illustrated in FIG. 17, the supporting parts 63 are disposed on both outsides of the locations corresponding to each node of oscillation of the oscillation parts 24. Namely, the resonator as a whole includes protruding portions 64 as the structure continuously integrated with the oscillating parts 24 on both outsides of the locations corresponding to each node of oscillation of the oscillation parts 24, and the supporting parts 63 disposed under the protruding portions 64, so that each of the nodes of oscillation parts 24 are supported by both sides. In the oscillation parts 24, the oscillation is generated in the fundamental drive mode supported at every wavelength, i.e., in the secondary drive mode supported at every half-wavelength. Namely, the present resonator has a structure such that each unit resonator element in the oscillation parts 24 is supported by six supporting parts.

In the case where the oscillation parts 24 are formed by connecting the supporting parts 66 from both sides at every node of the oscillation parts 24, as illustrated in FIG. 17, Q values of the resonator increase, the resonance mode is limited, and the accuracy of Q value increases.

In the supporting method of FIG. 18, the supporting parts 66 are disposed on both outsides of the locations corresponding to each node being apart with each other by one wavelength of oscillation of the oscillation parts 24. That is, the resonator as a whole includes supporting portions 66 as the structure continuously integrated with the oscillating parts 24 on both outsides of the locations corresponding to each node being apart with each other by one wavelength of oscillation of the oscillation parts 24, and fixing parts 63 disposed under fixing portions 64 connected to the supporting portions 66. Namely, the present resonator has a structure such that each resonator part 24 is supported by four supporting parts 66. Since each resonator part 24 in the present structure oscillates in the secondary drive mode, this structure can be adapted to the resonator utilizing the resonance frequency in the secondary mode.

In the case where the oscillation parts 24 are formed by connecting the supporting parts 66 from both sides at the location of every other node of the oscillation, as illustrated in FIG. 18, the resonators with high Q values can be formed.

In addition, while not shown in the drawing, in the resonator utilizing the resonance frequency in the third mode, two nodes of the oscillation in each unit resonator element are generated between the supporting parts 66 disposed at both ends.

The supporting method of FIG. 19 is adapted to support the resonator utilizing the resonance frequency in the secondary mode. In this supporting method, the supporting parts 66 are disposed alternately on inner and outer circumferences of the oscillating part 24, i.e., one support part 66 is disposed for each node of the oscillation. That is, the resonator is constructed by forming each of the supporting parts 66 alternately on inner and outer circumferences of the oscillating parts 24 corresponding to the location of the node of oscillation, and by disposing the fixing parts 63 under fixing portions 64 connected to the supporting portions 66. Namely, the present resonator has a structure such that each of the oscillating parts 24 in the unit resonator element is supported by three supporting parts 63.

In the case where the resonator is formed, as illustrated in FIG. 19, by connecting the supporting parts 66 alternately on inner and outer circumferences of the oscillating parts 24 with respect to the nodes of the oscillation, high Q values can be obtained, and stable Q values are also obtained with more ease since the stability of resonance state increases compared with the case of the resonators which includes nodes without the support by the supporting parts.

Figure 24:
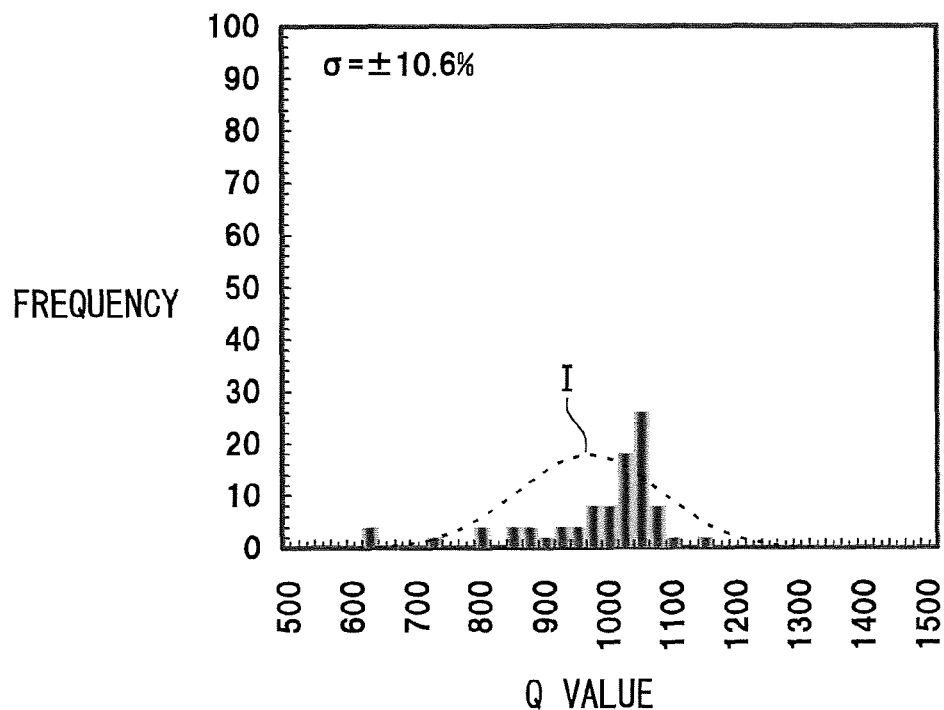
FIG. 24 is a graph for use in explaining the variability of Q value for four-point support according to an embodiment of the present invention.
Figure 25:
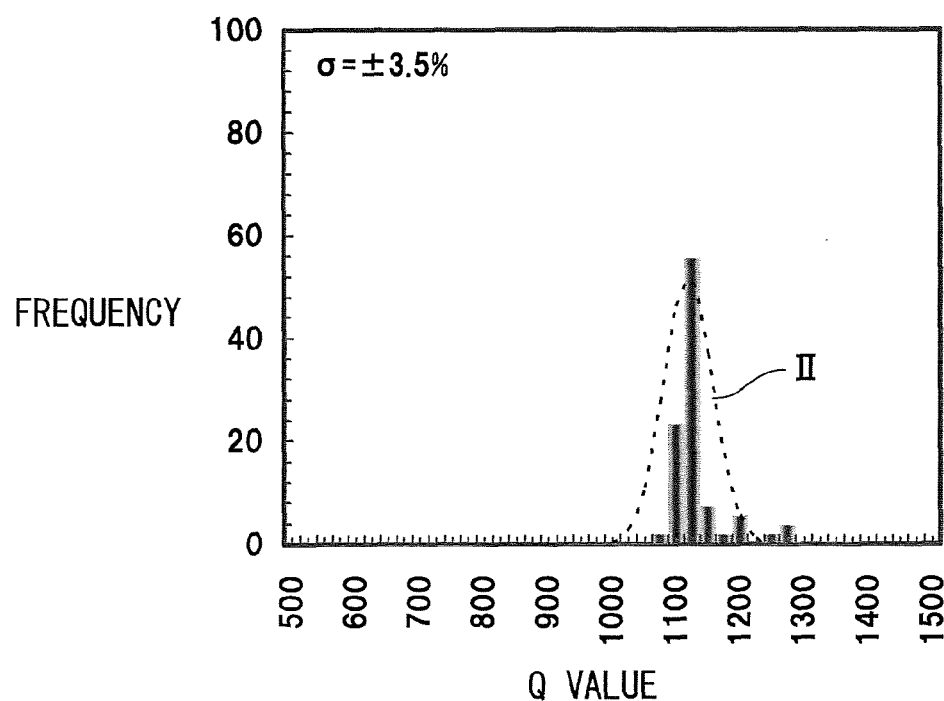
FIG. 25 is a graph for use in explaining the variability of Q value for six-point support according to an embodiment of the present invention.

In the resonator of the abovementioned configuration, in which the oscillation parts 24 in the form of the closed system are supported from the outsides, it is noted herein with respect to the unit resonator element that the variability of Q values is smaller for (a) the structure of supporting the oscillation parts 24 by the supporting parts 63 at every nodal point as shown in FIG. 17, i.e., the aforementioned six-point support, compared with (b) the structure of supporting the oscillation parts 24 by the supporting parts 66 at every other nodal point as shown in FIG. 18, i.e., the aforementioned four-point support. FIG. 24 is a graph illustrating the variability of Q value for the four-point support. FIG. 25 is another graph illustrating the variability of Q value for the six-point support. The horizontal axis of the graph represents Q value, while the vertical axis represents the frequency of the Q value.

From the data shown in the graphs of FIGS. 24 and 25, there obtained are standard deviation values o as the index for the variability of Q value, i.e., for the four-point support with the normal distribution curve I, a standard deviation value has been obtained as σ=±10.6%; while for the six-point support with the normal distribution curve II, another standard deviation value has been obtained as σ=±3.5%. Accordingly, the variability of Q value for the six-point support obtained is less than the four-point support. The Q value is one of the important parameters for determining product quality and the small value of Q value variability will lead to small product variability.

Figure 20:
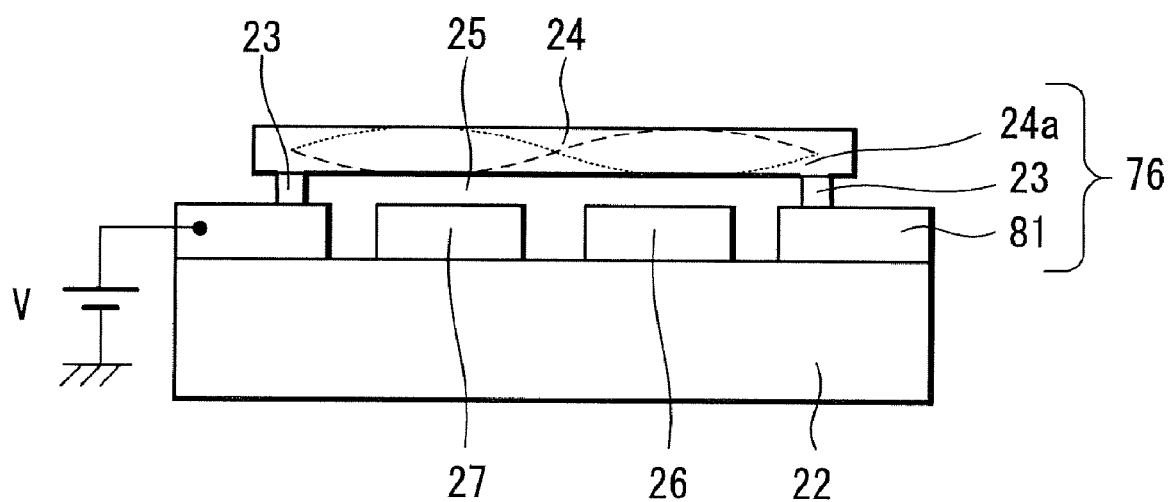
FIG. 20 is a configuration diagram illustrating an example of a supporting mechanism for supporting an oscillation part according to an embodiment of the present invention.
Figure 21:
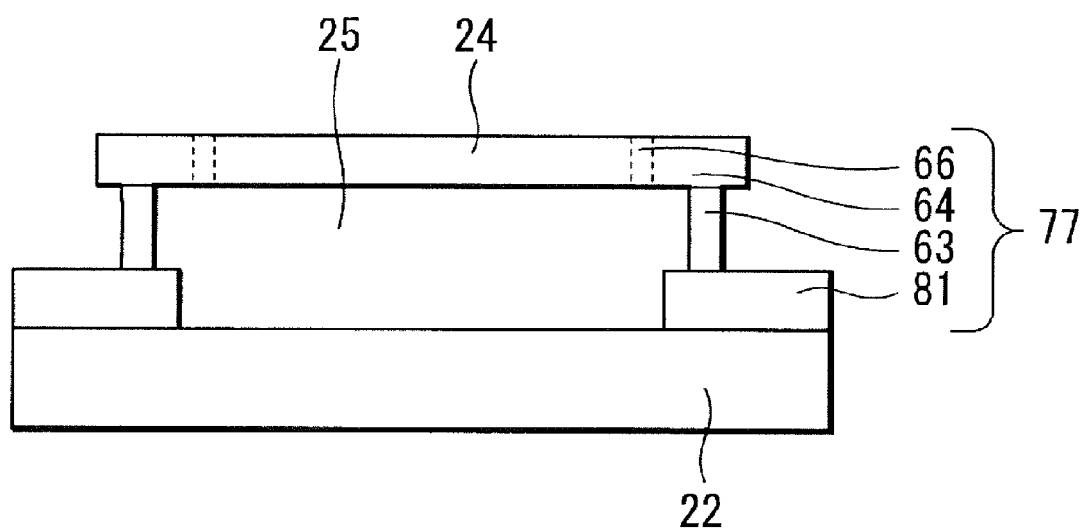
FIG. 21 is a configuration diagram illustrating another example of a supporting mechanism for supporting an oscillation part according to an embodiment of the present invention.
Figure 22:
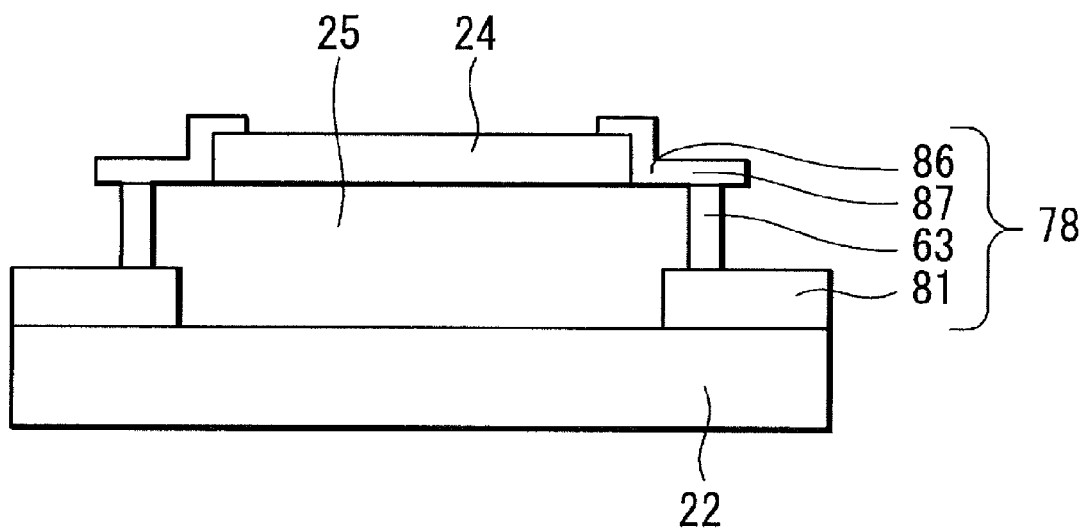
FIG. 22 is a configuration diagram illustrating still another example of a supporting mechanism for supporting an oscillation part according to an embodiment of the present invention.

FIGS. 20 through 22 illustrate several examples of supporting mechanism for the oscillation parts 24. The supporting mechanism of FIG. 20 illustrates the example of disposing a supporting part 23 under an oscillation part 24. The supporting mechanism 76 of the example includes conductive seats 81 simultaneously formed on the substrate 22 with an input electrode 26 and an output electrodes 27 as lower electrodes, support regions 24a corresponding to the node of oscillation of the oscillation part 24, and supporting parts 23 each fixed to the seats 81 to support the supporting regions 24a on the side of the oscillation part 24. The reference numeral 25 indicates the space between the lower electrodes and the oscillation part 24.

The seats 81 are formed with the same material as lower electrodes, having the same film thickness. During the fabrication process, by forming the seats 81, the input electrode 26 and the output electrode 27 as lower electrodes, and wirings 41, 42 connected to these electrodes as lower electrodes (refer to FIGS. 12A and 12B, FIGS. 15A and 15B, and FIGS. 16A, 16B, and 16C) under the (first) same process, and forming the oscillation part 24 and the supporting part 23 under the (second) same process, the fabrication can be carried out with a high degree of precision.

The supporting mechanism of FIG. 21 illustrates the example of disposing supporting parts 66 outside an oscillation part 24. The supporting mechanism 77 of the present example includes conductive seats 81 simultaneously formed on the substrate 22 with an input electrode 26 and an output electrode 27 as lower electrodes; supporting parts 66 which are formed to be integrated with, and continuous outward from, the oscillation part 24; fixing parts 64 each connected to supporting parts 66; and fixing parts 63 each fixed to seats 81 to support the fixing parts 64. The reference numeral 25 indicates the space.

The seats 81 are formed with the same material as lower electrodes, having the same film thickness. The supporting parts 66 are each formed integrally as extended portions of the oscillation part 24, and disposed at the location corresponding to the nodes of oscillation of the oscillation part 24. The supporting parts 66 are each formed, in a similar manner to the aforementioned, including a narrow portion and a wide portion, the former being on the side in contact with the oscillation part 24. During the fabrication process, by forming the seats 81, the input electrode 26 and the output electrode 27 as lower electrodes, and wirings connected to these electrodes (for example, refer to the wiring layers 41 and 42 of FIG. 4) under the (first) same process, and forming the supporting parts 66, the fixing parts 64, and the fixing parts 63 under the (second) same process, the fabrication can be carried out with a high degree of precision.

The first difference between the supporting mechanisms 77 and 76 is in the arrangement of the supporting parts. In the supporting mechanism 77, the supporting parts 63 are formed outside of the closed system (in the form of circle, polygon, or track) of the oscillating parts 24. The second difference is in the movement of the supporting parts. The supporting parts 23 in the supporting mechanism 76 are subjected to the bending motion, while the supporting parts 63 in the supporting mechanism 77 are subjected to the torsional movement.

The supporting mechanism of FIG. 22 illustrates the example of varying the ratio of rigidity between the oscillating part 24 and the supporting part 86. The supporting mechanism 78 of the present example includes supporting parts 86 each formed of materials different from the oscillating part 24, fixing parts 87 integrally connected to the supporting parts 86, fixing parts 63 each disposed under fixing parts 87, and seats 81. In this case, each of the supporting parts 86 is formed as an integral structure with the oscillation part 24 so that some portion of the supporting part 86 overlaps with the oscillation part 24. In particular, by varying the material for forming the supporting parts 86 of the protruding portion to be different from that for forming the oscillation part 24, the strength of support can be controlled to a large extent.

Figure 23A:
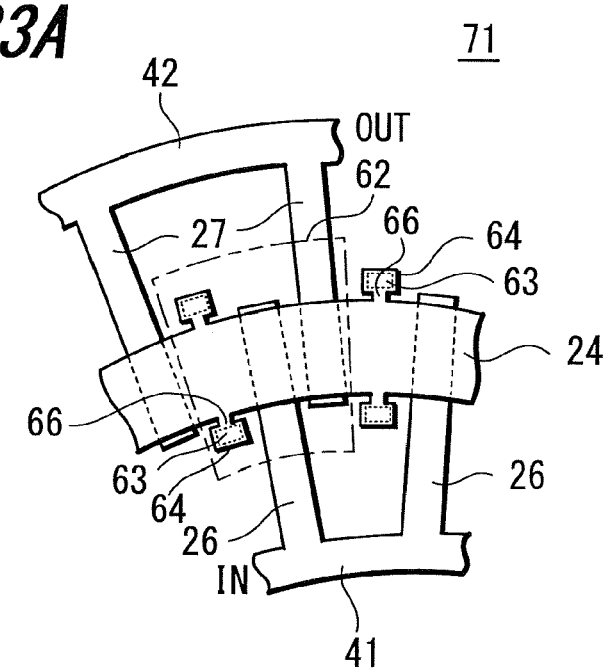
FIGS. 23A and 23B are a plan view for use in explaining an oscillation part formed with a curvature, and a perspective view illustrating the principal part of the structure of FIG. 23A, respectively.
Figure 23B:
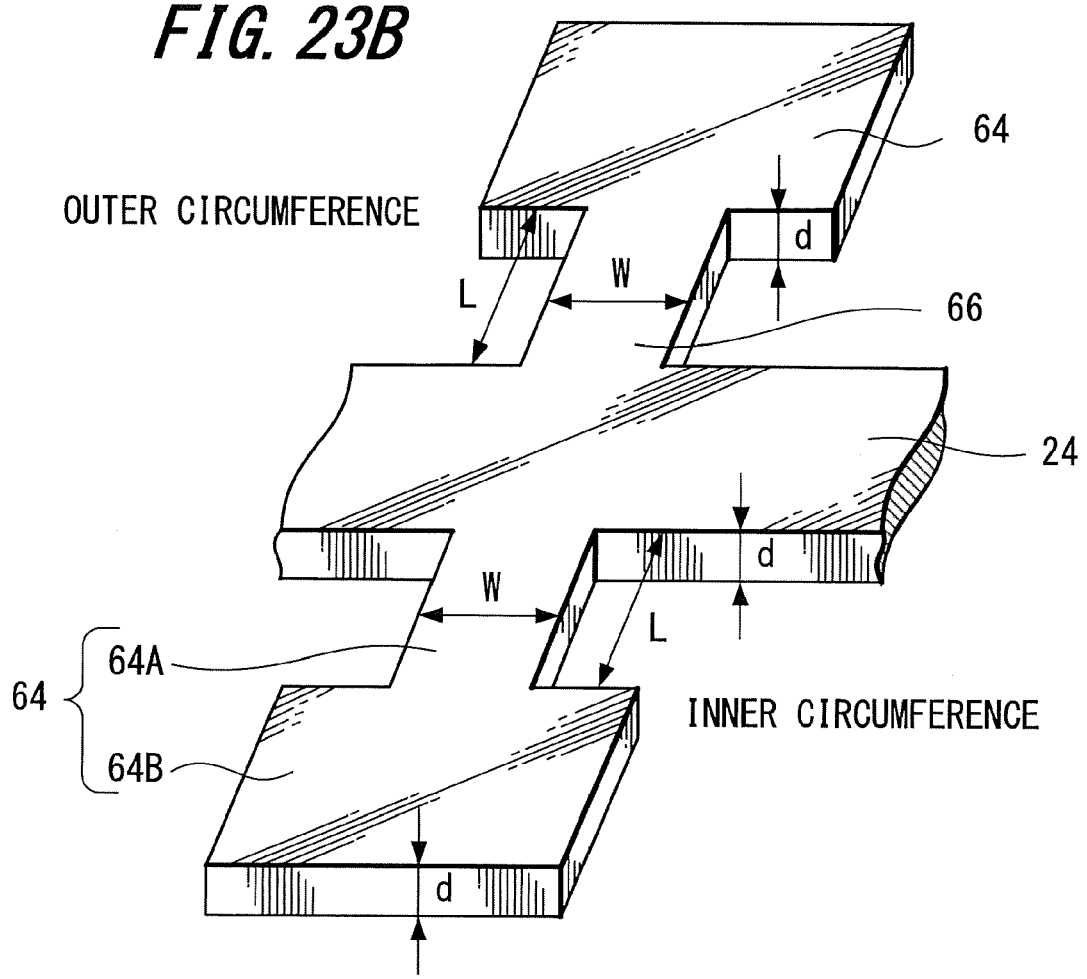

In the aforementioned resonator of circular ring type shown in FIGS. 23A and 23B and similar other resonators, there arises the difference in the shape between the inner and outer circumferences of the resonator element 22. Because of the difference in the curvature of the inner and the outer circumferences, there gives rise to the difference in the width of the region which can be regarded as the node of oscillation. That is, the width of the region as the node is smaller on the inner circumference side than the outer side in the closed system. It is desirable in such a structure to provide the size difference, as shown in FIG. 23B and Table 1, between the inner and outer circumferences in the structure of the supporting parts 66.

TABLE 1

|  | Length L | Width W | Thickness d | Hardness |
|---|---|---|---|---|
| Outer circumference | Short | Broad | Thick | Hard |
| Inner circumference | Long | Narrow | Thin | Soft |

As shown in Table 1, with regard to first and second narrow portions 64A on the inner and outer circumferences of the oscillating parts 24 in the closed system, respectively, all or some of the length L, width W, thickness d, and the hardness of respective narrow portions 64A can be varied to be different with each other according to Table 1. By varying physical quantities of the protruding portions 64A to be different with each other between the inner and outer circumferences of the oscillating parts 24, as mentioned just above, the spring effect on oscillators in supporting portions is made equivalent on both the inner and outer circumferences, and advantages are provided of bringing the resonance of the oscillators to be uniform on both inner and outer circumferences of the circular ring. As a result, high Q values can be retained.

With regard to the resonators according to the aforementioned embodiments of the invention, by disposing a plurality of resonator elements in line and circularly to be the closed system, further by arranging the oscillation parts continuously as an integrated structure, thereby generating the oscillations at higher mode as a whole, the structure of each oscillator element is rendered equal to each other and the stress exerted to each oscillator part in the oscillator element is also rendered equal.

With the present configuration, the variability in the characteristics of each unit resonator element decreases, and the decrease in Q values caused by the parallelization is suppressed, the Q value equivalent to that with a unit resonator can be obtained. In addition, the leak of oscillation energy of the oscillation parts to the substrate 22 by way of oscillation parts is decreased, so that the Q value higher than the unit resonator can be obtained.

Since parallel resonators with high Q value can be fabricated according to the aforementioned embodiments of the invention, RF elements such as an oscillator, filter, mixer and other similar elements utilizing the parallel resonators can be constructed. In addition, various devices and communication apparatuses utilizing the RF elements can also be constructed. In particular, the parallel resonator according the embodiments of the invention can be applied suitably for fabricating the oscillators, in that oscillators with high frequency stability can be fabricated.

The embodiment of the invention is capable of providing communication apparatuses, which are constructed with oscillators incorporating the aforementioned resonators according to the embodiments of the invention and configured to communicate utilizing electromagnetic waves, such as portable telephones, wireless LAN apparatuses, radio transceivers, TV tuners, radio tuners, and other similar apparatuses.

Figure 26:
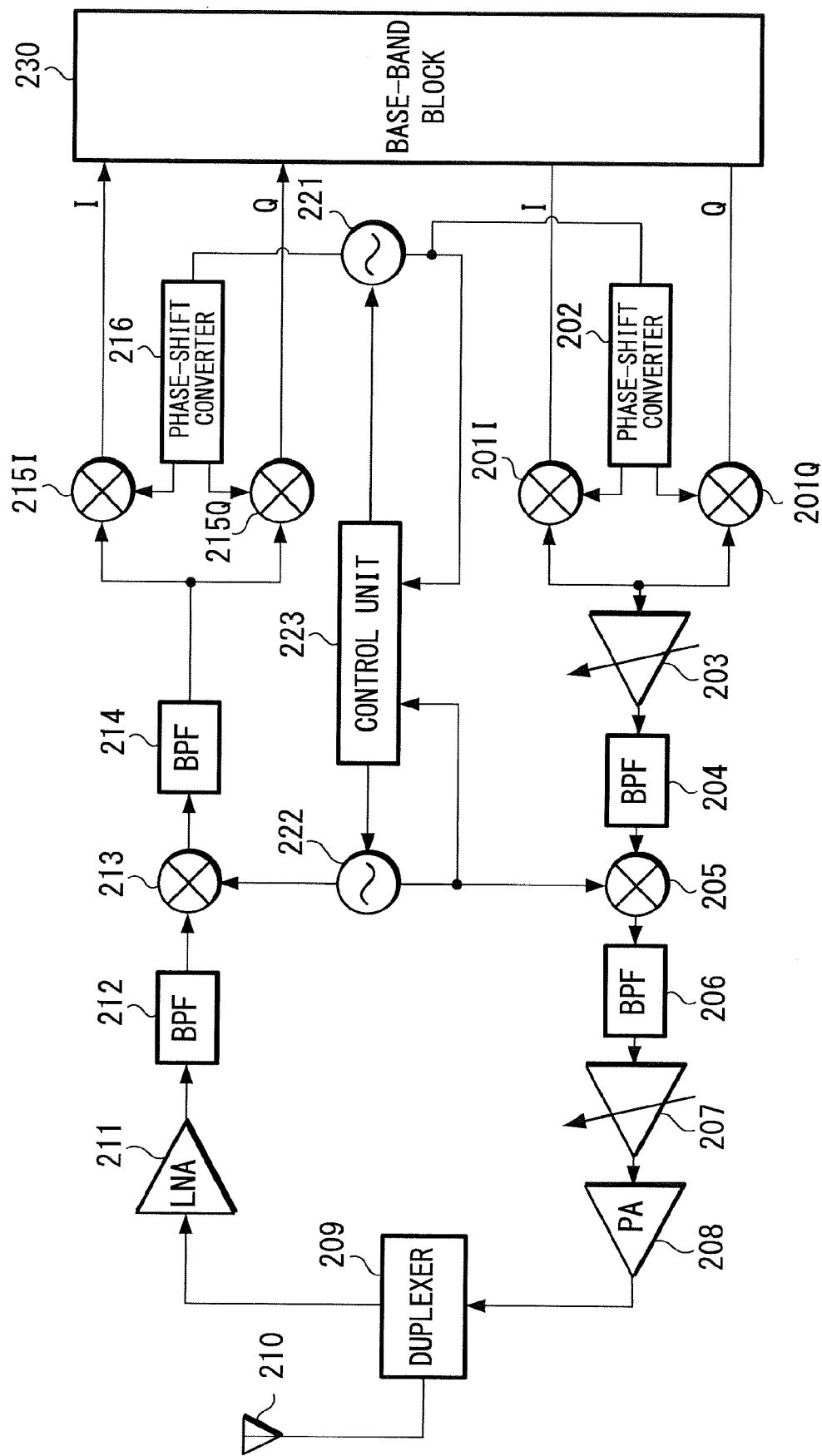
FIG. 26 is a circuit diagram illustrating a communication apparatus according to an embodiment of the present invention.

Referring to FIG. 26, described in the next place is an exemplary configuration of a communication apparatus incorporating the oscillators according to the aforementioned embodiments of the invention.

First, the configuration of transmission system is detailed hereinbelow. I channel and Q channel transmitting signals are supplied from a base-band block 230 to multipliers 201I and 201Q, respectively. The multipliers 201I and 201Q operate to multiply an oscillation output from an oscillator 221 by two respective signals of I channel and Q channel subsequent to prescribed phase-shift performed with phase-shift converter 202, and mix the thus multiplied signals into one line. Thus mixed signal is supplied to a multiplier 205 by way of a variable amplifier 203 and a band path filter 204, multiplied by the oscillation output from an oscillator 222, and subjected to frequency conversion into a transmitting frequency. The output from the multiplier 205 is supplied to an antenna 210 connected to a duplexer 209 by way of the band path filter 206, variable amplifier 207, and power amplifier 208, and rendered to radio transmission from the antenna 210. With the band path filters 204 and 206, frequency components other than the transmitting signal are removed. The duplexer 209 operates as a demultiplexing means for supplying transmitting frequency signals to the antenna side from the transmission system, also supplying receiving frequency signals from the antenna side to receiving system.

With respect to the receiving system, the signal received by the antenna 210 is supplied to a low noise amplifier 211 by way of the duplexer 209, and the amplified output with the low noise amplifier 211 is supplied to a multiplier 213. With the multiplier 213, the multiplication by the output from oscillator 222 is performed, and the signal at receiving frequency is converted into an intermediate frequency signal. Thus converted intermediate frequency signal is supplied to two multipliers 215I and 215Q through a band path filter 214. With each of the multipliers 215I and 215Q, the two signals subsequent to prescribed phase-shift performed with the phase-shift converter 216 are multiplied by the oscillation output from the oscillator 221, and I channel and Q channel receiving signals are obtained. Thus obtained I channel and Q channel receiving signals are supplied to the base-band block 230. Frequency components other than the signals are removed with the band path filters 212 and 214.

The oscillators 221 and 222 are configured so that oscillation frequencies thereof are controlled by a control unit 223, so that a PLL (phase locked loop) circuit is formed. The control unit 223 is provided with several components for the PLL circuit such as filters, comparators, and the like.

In the communication apparatus shown in FIG. 26, the oscillators with the configuration incorporating the aforementioned resonators according to the embodiments can be adapted to the oscillators 221 and 222.

By providing the oscillator incorporating parallel resonators with high Q values with regard to the communication apparatus according to an embodiment of the present invention, oscillator characteristics with improved frequency stability is obtained and communication apparatuses can be provided with excellent reliability.

Incidentally, while there described with reference to FIG. 26 are the examples adapted to the oscillators incorporated into communication apparatus performing radio transmission and reception, the oscillators may also be applied to ones included in communication apparatuses performing transmission and reception through the wire system. In addition, the oscillators in the examples may also be adapted to ones incorporated into communication apparatus carrying out only transmission processing or reception processing. Still in addition, there may also be adapted is ones necessitated in other apparatuses for handling high frequency signals.

It should be understood by those skilled in the art that various modifications, combinations, sub-combinations and alterations of the invention may occur depending on design requirements and other factors insofar as they are within the scope of the appended claims or the equivalents thereof.

What is claimed is:

1. A resonator, comprising:
a plurality of resonator elements, each resonator element including at least associated oscillation parts and lower electrodes with an intervening space between each oscillation part and each associated lower electrode,
wherein
the plurality of resonator elements are annularly disposed in a closed system and
the oscillation parts of the plurality of resonator elements are continuous and integrated in an annulus,
the lower electrodes include an input electrode and an output electrode, and
the input electrode of each resonator element extends from an associated oscillating part toward a center of the closed system, the input electrode extending within an interior region of the annulus.

2. The resonator according to claim 1, wherein the plurality of resonator elements are symmetrically disposed with respect to a point for a center of the closed system.

3. The resonator according to claim 2, wherein the plurality of resonator elements are disposed to form any one of circular and polygonal ring arrangements.

4. The resonator according to claim 1, wherein the oscillation parts are formed in a closed arrangement so that loops and nodes of an oscillation are respectively disposed at uniform intervals.

5. The resonator according to claim 1, wherein
a length of the oscillation parts in a closed arrangement is equal to an integral multiple of a wavelength of the oscillation.

6. The resonator according to claim 1, wherein supporting parts for supporting the oscillation parts are each disposed at nodal points of the oscillation.

7. The resonator according to claim 6, wherein the supporting parts are each disposed under the oscillation parts.

8. The resonator according to claim 7, wherein the supporting parts for supporting the oscillation parts are disposed at every nodal point of the oscillation of the oscillation parts in a circular arrangement thereof.

9. The resonator according to claim 7, wherein the supporting parts for supporting the oscillation parts are each disposed at every other nodal point of the oscillation of the oscillation parts in a circular arrangement thereof.

10. The resonator according to claim 6, wherein the supporting parts for supporting the oscillation parts are disposed outside the oscillation parts.

11. The resonator according to claim 10, wherein the supporting parts for supporting the oscillation parts are disposed outside of both inner and outer circumferences of the oscillation parts in a circular arrangement thereof at the locations corresponding to every nodal point of the oscillation.

12. The resonator according to claim 10, wherein the supporting parts for supporting the oscillation parts are disposed outside of both inner and outer circumferences of the oscillation parts in a circular arrangement thereof at the locations corresponding to every other nodal point of the oscillation.

13. The resonator according to claim 10, wherein
the supporting parts for supporting the oscillation parts are alternately disposed outside of inner and outer circumferences of the oscillation parts in a circular arrangement thereof at the locations each corresponding to every nodal point of the oscillation.

14. The resonator according to claim 10, wherein
the supporting parts are each formed outside the oscillation parts as a structure continuously integrated therewith.

15. The resonator according to claim 14, wherein the supporting parts are each formed on a same plane as the oscillation parts.

16. The resonator according to claim 14, wherein a shape of a cross section of the supporting parts that contacts the oscillation parts is a square.

17. An oscillator, comprising:
a resonator comprising a plurality of resonator elements, each resonator element including at least associated oscillation parts and lower electrodes with an intervening space between each oscillation part and each associated lower electrode
wherein
the plurality of resonator elements are annularly disposed in a closed system and
the oscillation parts of the plurality of resonator elements are continuous and integrated in an annulus,
the lower electrodes include an input electrode and an output electrode, and
the input electrode of each resonator element extends from an associated oscillating part toward a center of the closed system, the input electrode extending within an interior region of the annulus.

18. A communication apparatus, comprising:
an oscillator to be incorporated into the communication apparatus provided with an oscillation circuit adapted to frequency conversion,
wherein,
the oscillator is formed by including a plurality of resonator elements, each resonator element including at least associated oscillation parts and lower electrodes with an intervening space between each oscillation part and each associated lower electrode, disposed in a closed system, and
the oscillation parts of the plurality of resonator elements are continuous and integrated in an annulus,
the lower electrodes include an input electrode and an output electrode, and
the input electrode of each resonator element extends from an associated oscillating part toward a center of the closed system, the input electrode extending within an interior region of the annulus.

* * * * *